United States Patent
Rusli et al.

(10) Patent No.: US 7,842,541 B1
(45) Date of Patent: Nov. 30, 2010

(54) ULTRA THIN PACKAGE AND FABRICATION METHOD

(75) Inventors: Sukianto Rusli, Phoenix, AZ (US); Ronald Patrick Huemoeller, Gilbert, AZ (US); Bob Shih-Wei Kuo, Chandler, AZ (US); Lee John Smith, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 12/237,173

(22) Filed: Sep. 24, 2008

(51) Int. Cl.
H01L 21/00 (2006.01)
(52) U.S. Cl. .................. 438/106; 438/110
(58) Field of Classification Search .......... 438/106, 438/125, 110
See application file for complete search history.

(56) References Cited

U.S. PATENT DOCUMENTS

| | | | |
|---|---|---|---|
| 3,324,014 A | 6/1967 | Modjeska | |
| 6,035,527 A | 3/2000 | Tamm | |
| 6,194,250 B1 | 2/2001 | Melton et al. | |
| 6,730,857 B2 | 5/2004 | Konrad et al. | |
| 6,740,964 B2 | 5/2004 | Sasaki | |
| 6,919,514 B2 | 7/2005 | Konrad et al. | |
| 6,930,256 B1 | 8/2005 | Huemoeller et al. | |
| 6,951,773 B2 * | 10/2005 | Ho et al. | 438/106 |
| 7,211,889 B2 * | 5/2007 | Shim | 257/711 |
| 7,242,081 B1 | 7/2007 | Lee | |
| 7,297,562 B1 | 11/2007 | Huemoeller et al. | |
| 7,345,361 B2 | 3/2008 | Mallik et al. | |
| 7,372,151 B1 | 5/2008 | Fan et al. | |
| 7,405,103 B2 * | 7/2008 | Chang | 438/108 |
| 7,429,502 B2 * | 9/2008 | Archer et al. | 438/122 |
| 7,462,933 B2 | 12/2008 | Zhao et al. | |
| 2007/0273049 A1 | 11/2007 | Khan et al. | |
| 2007/0290376 A1 | 12/2007 | Zhao et al. | |
| 2008/0230887 A1 | 9/2008 | Sun et al. | |

OTHER PUBLICATIONS

Berry et al., "Thin Stacked Interposer Package", U.S. Appl. No. 11/865,617, filed Oct. 1, 2007.
Scanlan, "Package-on-package (PoP) with Through-mold Vias",*Advanced Packaging*, Jan. 2008, 3 pages, vol. 17, Issue 1, PennWell Corporation.
Kim et al., "Application of Through Mold Via (TMV) as PoP base package", *58th ECTC Proceedings*, May 2008, Lake Buena Vista, FL, 6 pages, IEEE.
Huemoeller et al., "Thin Substrate Fabrication Method and Structure", U.S. Appl. No. 11/953,680, filed Dec. 10, 2007.
Huemoeller et al., "Circuit-on-foil Process for Manufacturing a Laminated Semiconductor Package Substrate Having Embedded Conductive Patterns", U.S. Appl. No. 11/982,637, filed Nov. 1, 2007.

* cited by examiner

*Primary Examiner*—S. V Clark
(74) *Attorney, Agent, or Firm*—Gunnison, McKay & Hodgson, L.L.P.; Serge J. Hodgson

(57) ABSTRACT

A method includes forming a substrate layer, the substrate layer including a circuit pattern having terminals and bump pads. A stiffener is formed, the stiffener including via apertures having electrically conductive via aperture sidewalls and an electronic component opening. The stiffener is attached to the substrate layer. The electrically conductive via aperture sidewalls are electrically connected to the terminals. An electronic component is mounted to the bump pads and within the electronic component opening thus minimizing the height of the package. Further, the stiffener minimizing undesirable bending of the package and acts as an internal heat sink.

19 Claims, 18 Drawing Sheets

ULTRA THIN PACKAGE AND FABRICATION METHOD

BACKGROUND OF THE INVENTION

1. Field of the Invention

The present invention relates to the field of electronics, and more particularly, to methods of forming electronic component packages and the related structures.

2. Description of the Related Art

As substrates for electronic component packages become increasingly thin, the substrates become increasingly flexible. Unfortunately, undesirable bending of a substrate can lead to failure of the electrical interconnections formed with the substrate. Also, heat buildup in the substrate can cause premature failure of the package.

SUMMARY OF THE INVENTION

A method includes forming a substrate layer, the substrate layer including a circuit pattern having terminals and bump pads. A stiffener is formed, the stiffener including via apertures having electrically conductive via aperture sidewalls and an electronic component opening. The stiffener is attached to the substrate layer. The electrically conductive via aperture sidewalls are electrically connected to the terminals. An electronic component is mounted to the bump pads and within the electronic component opening thus minimizing the height of the package. Further, the stiffener minimizing undesirable bending of the package and acts as an internal heat sink.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
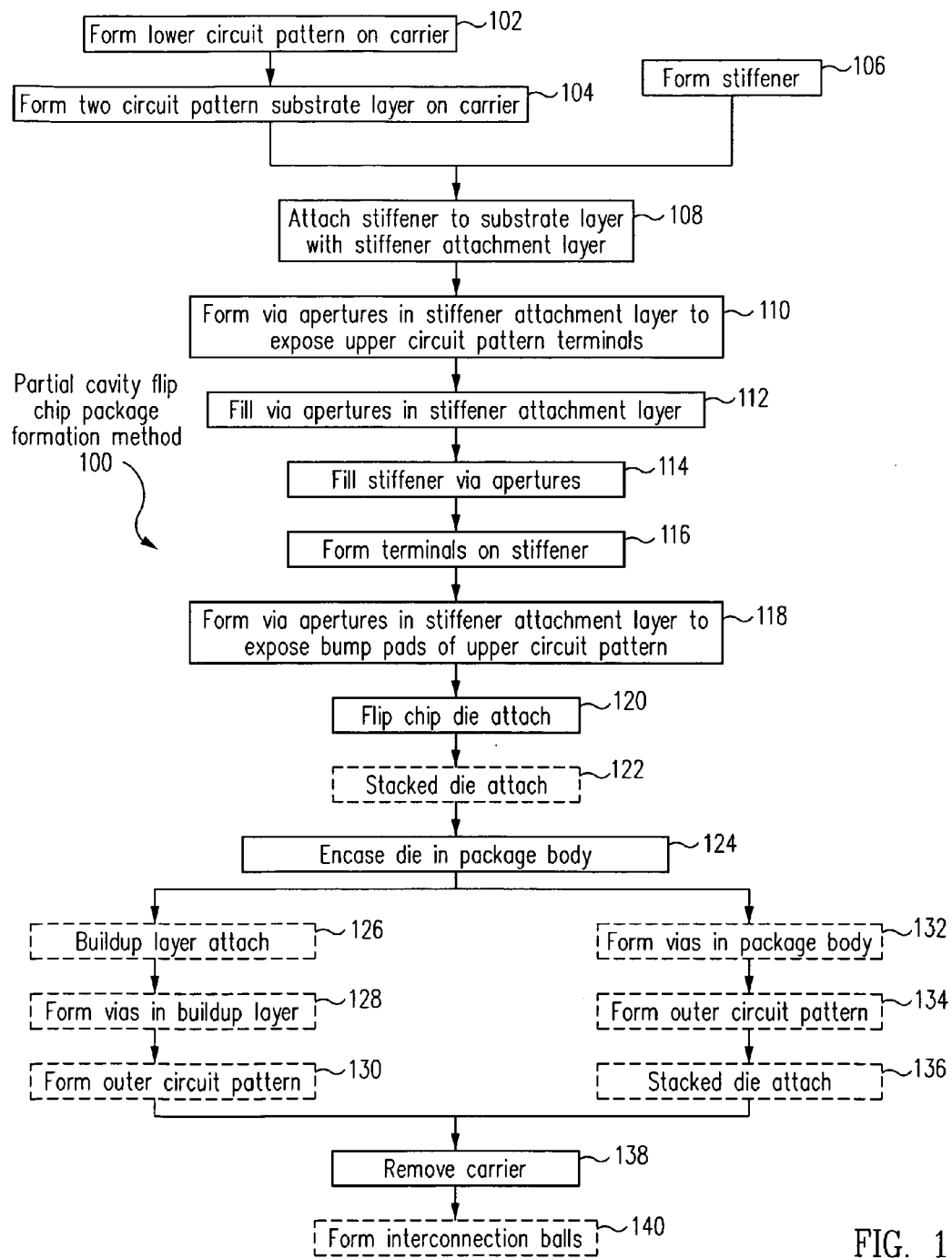
FIG. 1 is a flow diagram of a partial cavity flip chip package formation method in accordance with one embodiment.
Figure 2:
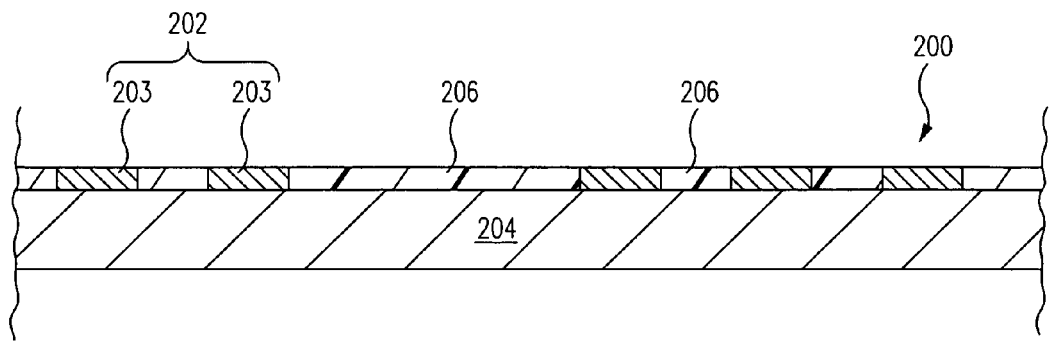
FIG. 2 is a cross-sectional view of a substrate layer during fabrication in accordance with one embodiment.

FIG. 1 is a flow diagram of a partial cavity flip chip package formation method 100 in accordance with one embodiment. FIG. 2 is a cross-sectional view of a substrate layer 200 during fabrication in accordance with one embodiment.

Referring now to FIGS. 1 and 2 together, in a form lower circuit pattern on carrier operation 102, a lower, e.g., first, circuit pattern 202 is formed on a carrier 204. Lower circuit pattern 202 includes a plurality of terminals 203, sometimes called lands, traces, and/or other electrically conductive features. Lower circuit pattern 202 is formed of electrically conductive material such as copper.

Carrier 204 is formed of a rigid material providing stiffness and support during the manufacture of the partial cavity flip chip package as discussed further below. In one embodiment, carrier 204 is formed of an electrically conductive material allowing carrier 204 to form an electrode for electroplating of lower circuit pattern 202 thereon.

In one embodiment, a first buildup layer 206 is formed on carrier 204. First buildup layer 206 is patterned to expose portions of carrier 204 corresponding to a positive image of lower circuit pattern 202. The openings in first buildup layer 206 are filled with an electrically conductive material to form lower circuit pattern 202.

In one embodiment, the openings in first buildup layer 206 are filled by electroplating an electrically conductive material such as copper to form lower circuit pattern 202. In other examples, the openings in first buildup layer 206 are filled with an electrically conductive paste, that is cured, if necessary, to form lower circuit pattern 202.

After formation of lower circuit pattern 202, first buildup layer 206 is removed. However, in another example, first buildup layer 206 is not removed and forms part of the substrate layer, e.g., part of dielectric layer 312 of FIG. 3, as discussed further below.

Figure 3:
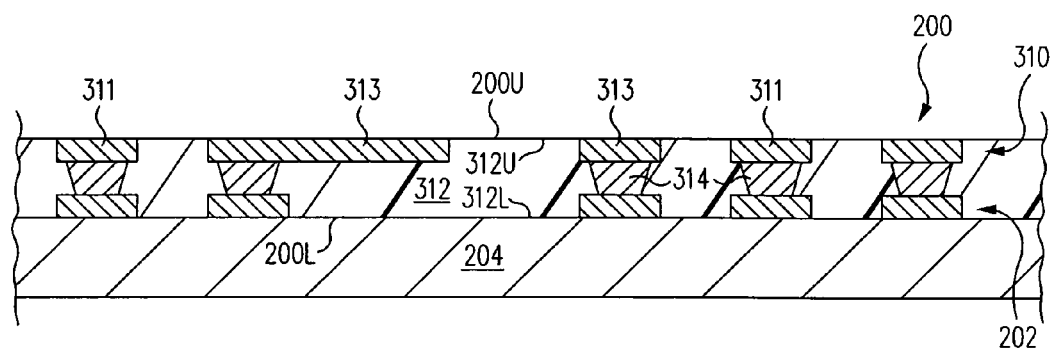
FIG. 3 is a cross-sectional view of the substrate layer of FIG. 2 at a further stage during fabrication in accordance with one embodiment.

FIG. 3 is a cross-sectional view of substrate layer 200 of FIG. 2 at a further stage during fabrication in accordance with one embodiment. Referring now to FIGS. 1, 2, and 3 together, from form lower circuit pattern on carrier operation 102, flow moves to a form two circuit pattern substrate layer on carrier operation 104. In form two circuit pattern substrate layer on carrier operation 104, substrate layer 200 including lower circuit pattern 202 at a lower, e.g., first, surface 200L of substrate layer 200 and an upper, e.g., second, circuit pattern 310 at an upper, e.g., second, surface 200U of substrate layer 200 is formed.

More particularly, substrate layer 200 includes a dielectric layer 312 including a lower, e.g., first, surface 312L and an opposite upper, e.g., second, surface 312U.

Lower circuit pattern 202 is embedded into dielectric layer 312 at lower surface 312L. Similarly, upper circuit pattern 310 is embedded into dielectric layer 312 at upper surface 312U. Lower circuit pattern 202 and upper circuit pattern 310 are electrically connected to one another by electrically conductive vias 314 extending through dielectric layer 312.

Upper circuit pattern 310 includes a plurality of terminals 311, sometimes called lands, traces, bump pads 313, and/or other electrically conductive features. Upper circuit pattern 310 is formed of electrically conductive material such as copper.

In one embodiment, to form substrate layer 200, lower surface 312L of dielectric layer 312 is adhered to lower circuit pattern 202 and carrier 204. Dielectric layer 312 had sufficient fluidity to flow around and enclose lower circuit pattern 202.

Laser-ablated artifacts, e.g., via apertures and circuit pattern channels, are formed in dielectric layer 312. Illustratively, the laser-ablated artifacts are formed by directing a laser at upper surface 312U of dielectric layer 312.

These laser-ablated artifacts are filled with electrically conductive material. For example, copper is plated in the laser-ablated artifacts thus forming upper circuit pattern 310 and vias 314.

In another embodiment, upper circuit pattern 310 is embedded, e.g., laminated, into upper surface 312U of dielectric layer 312. Illustratively, upper circuit pattern 310 is formed on an upper carrier in a manner similar to the formation of lower circuit pattern 202 on carrier 204. Lower circuit pattern 202 and upper circuit pattern 310 are embedded into dielectric layer 312 simultaneously, or sequentially.

In one example, by pressing lower circuit pattern 202 and upper circuit pattern 310 into dielectric layer 312 while at the same time heating dielectric layer 312, dielectric layer 312 flows around lower circuit pattern 202 and upper circuit pattern 310 to the respective carriers. The upper carrier (similar to carrier 204) upon which upper circuit pattern 310 is formed is removed, e.g., by etching, peeling, mechanical grinding or other removable technique.

Via apertures are formed between upper circuit pattern 310 and lower circuit pattern 202, e.g., using laser-ablation, mechanical drilling or other via aperture formation technique. The via apertures are filled, e.g., by plating or screening a paste, thus forming electrically conductive vias 314.

Referring again FIG. 1, partial cavity flip chip package formation method 100 further includes a form stiffener operation 106. In form stiffener operation 106, a stiffener is formed.

In one embodiment, the stiffener is formed from a dielectric core as described below in reference to FIGS. 4-7. In another embodiment, the stiffener is formed from an electrically conductive core as described below in reference to FIGS. 8-12.

Figure 4:
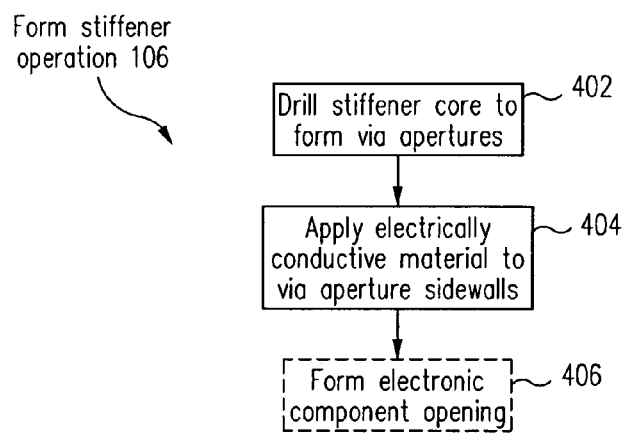
FIG. 4 is a flow diagram of a form stiffener operation of the partial cavity flip chip package formation method of FIG. 1 in the case when a stiffener is formed from a dielectric core in accordance with one embodiment.
Figure 5:
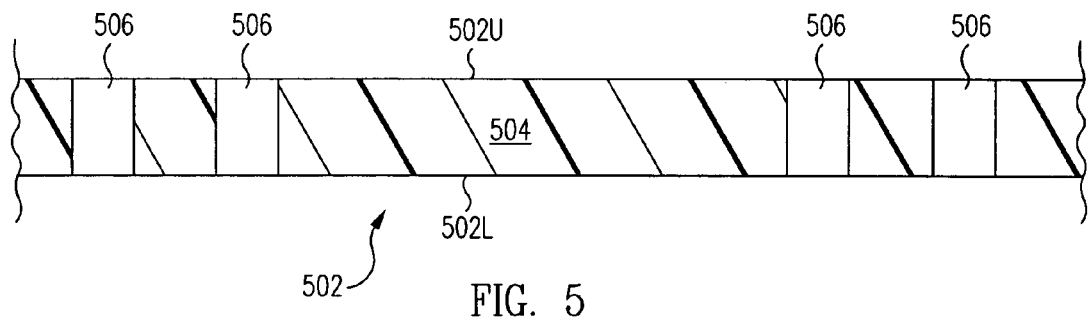
FIG. 5 is a cross-sectional view of a stiffener during fabrication in accordance with one embodiment.

Referring now to FIGS. 1, 4 and 5 together, FIG. 4 is a flow diagram of form stiffener operation 106 of partial cavity flip chip package formation method 100 of FIG. 1 in the case when a stiffener is formed from a dielectric core in accordance with one embodiment. FIG. 5 is a cross-sectional view of a stiffener 502 during fabrication in accordance with one embodiment.

Referring now to FIGS. 4 and 5 together, in a drill stiffener core to form via apertures operation 402, a stiffener core 504 is drilled to form via apertures 506 therein. More particularly, stiffener 502 includes a lower, e.g., first, surface 502L and an opposite upper, e.g., second, surface 502U. Via apertures 506 are formed entirely through stiffener core 504 and extend between upper surface 502U and lower surface 502L of stiffener 502. Via apertures 506 are formed by laser-ablation, mechanical drilling or other via aperture formation technique.

In accordance with this embodiment, stiffener core 504 is a dielectric material such as prepreg, printed circuit board material, an unclad core, e.g., a fully cured laminate material, or other dielectric material. In one specific example, stiffener core 504 is an epoxy resin which can include glass fibers.

Figure 6:
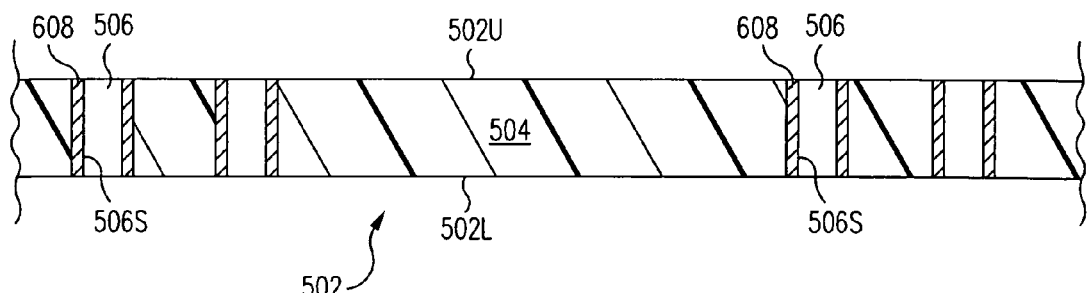
FIGS. 6 and 7 are cross-sectional views of the stiffener of FIG. 5 at further stages during fabrication.
Figure 7:
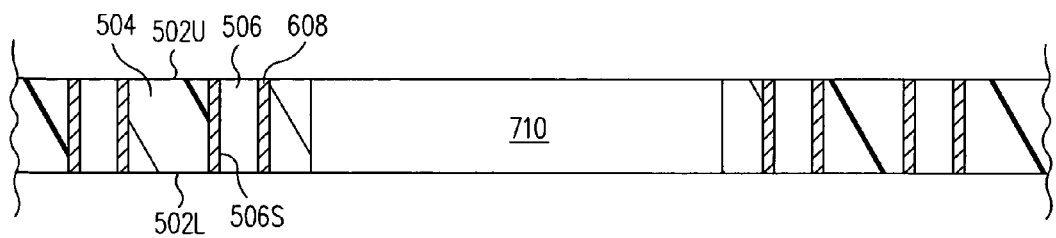

FIGS. 6 and 7 are cross-sectional views of stiffener 502 of FIG. 5 at further stages during fabrication. Referring now to FIGS. 4 and 6 together, from drill stiffener core to form via apertures operation 402, flow moves to an apply electrically conductive material to via aperture sidewalls operation 404. In apply electrically conductive material to via aperture sidewalls operation 404, an electrically conductive material 608, e.g., copper, is applied, e.g., by plating, to via aperture sidewalls 506S to cause via aperture sidewalls 506S to become electrically conductive.

Referring now to FIGS. 4 and 7 together, from apply electrically conductive material to via aperture sidewalls operation 404, flow moves, optionally, to a form electronic component opening operation 406. In form electronic component opening operation 406, an electronic component opening 710 is formed, e.g., by punching, in stiffener core 504. As shown in FIG. 7, electronic component opening 710 extends entirely through stiffener 502 from upper surface 502U to lower surface 502L.

Accordingly, stiffener 502 includes via apertures 506 having electrically conductive via aperture sidewalls 506S and electronic component opening 710. Generally, stiffener 502 is rigid, i.e., very stiff, and desirably has a high thermal conductivity to readily allow heat dissipation therefrom.

As discussed further below, in an alternative wirebond configuration, stiffener 502 is formed without electronic component opening 710. In accordance with the wirebond configuration, form electronic component opening operation 406 is not performed and thus is an optional operation.

Figure 8:
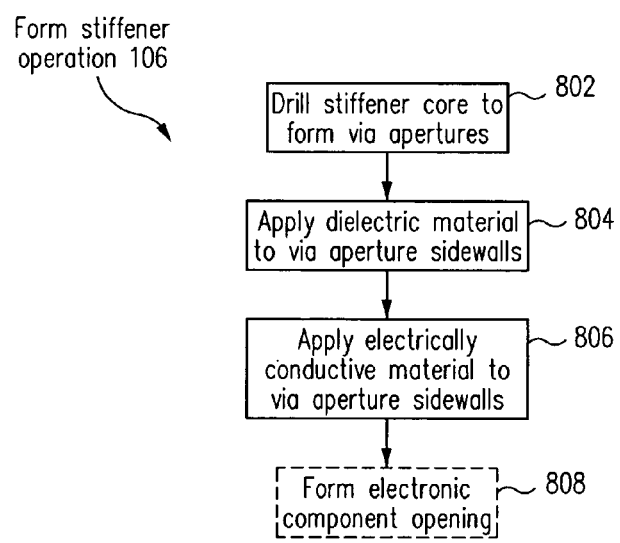
FIG. 8 is a flow diagram of the form stiffener operation of the partial cavity flip chip package formation method of FIG. 1 in the case when a stiffener is formed from an electrically conductive core in accordance with one embodiment.
Figure 9:
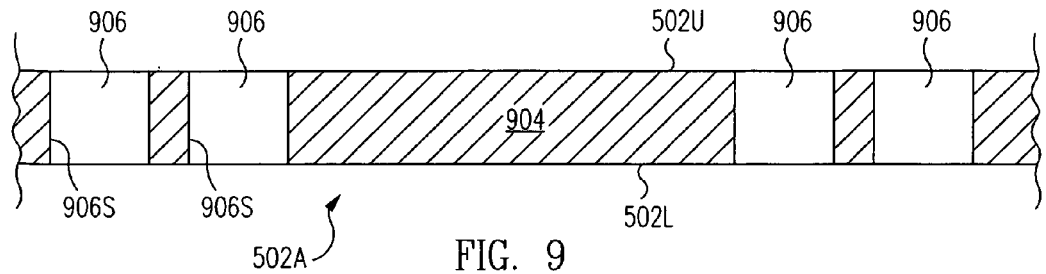
FIG. 9 is a cross-sectional view of a stiffener during fabrication in accordance with one embodiment.

Referring now to FIGS. 1, 8 and 9 together, FIG. 8 is a flow diagram of form stiffener operation 106 of partial cavity flip chip package formation method 100 of FIG. 1 in the case when a stiffener is formed from an electrically conductive core in accordance with one embodiment. FIG. 9 is a cross-sectional view of a stiffener 502A during fabrication in accordance with one embodiment.

Referring now to FIGS. 8 and 9 together, in a drill stiffener core to form via apertures operation 802, a stiffener core 904 is drilled to form via apertures 906 therein. More particularly, stiffener 502A includes a lower, e.g., first, surface 502L and an opposite upper, e.g., second, surface 502U. Via apertures 906 are formed entirely through stiffener core 904 and extend between upper surface 502U and lower surface 502L of stiffener 502A. Via apertures 906 are formed by laser-ablation, mechanical drilling or other via aperture formation technique.

In accordance with this embodiment, stiffener core 904 is an electrically conductive material such as carbon, Copper Invar Copper (CIC), Copper Molybdenum Copper (CMC), a clad core, e.g., a fully cured laminate with attached copper, or other electrically conductive material.

Figure 10:
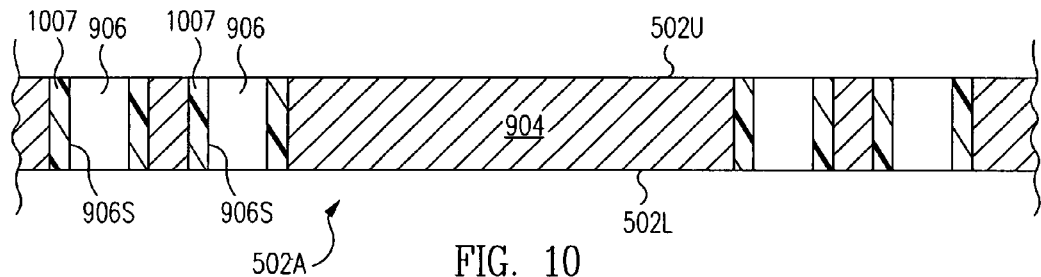
FIGS. 10, 11, and 12 are cross-sectional views of the stiffener of FIG. 9 at further stages during fabrication.
Figure 11:
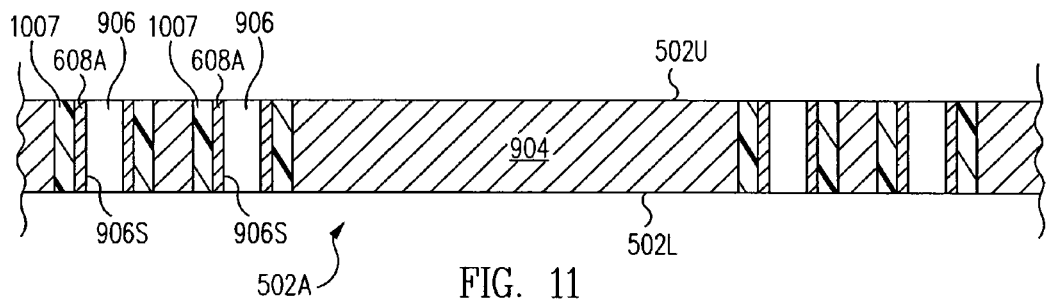
Figure 12:
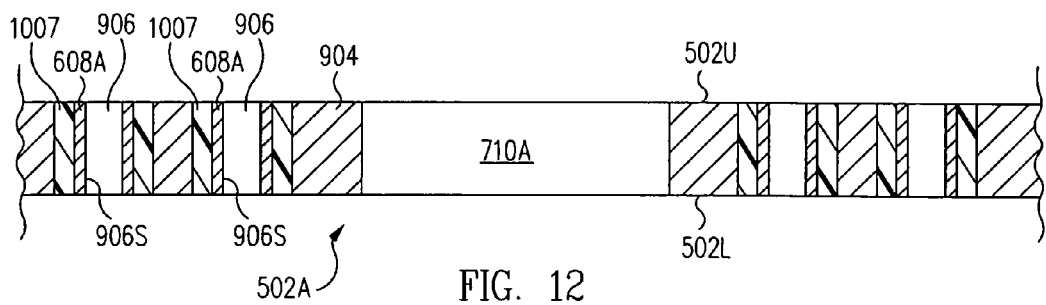

FIGS. 10, 11, and 12 are cross-sectional views of stiffener 502A of FIG. 9 at further stages during fabrication. Referring now to FIGS. 8 and 10 together, from drill stiffener core to form via apertures operation 802, flow moves to an apply dielectric material to via aperture sidewalls operation 804. In apply dielectric material to via aperture sidewalls operation 804, a dielectric material 1007 is applied to via aperture sidewalls 906S of via apertures 906 to cause via aperture sidewalls 906S to become nonconductive.

More particularly, as stiffener core 904 is formed of an electrically conductive material, via aperture sidewalls 906S are initially electrically conductive. Dielectric material 1007 is applied to via aperture sidewalls 906S to allow formation of electrically conductive vias in stiffener 502A which are electrically isolated from stiffener core 904.

In one embodiment, via apertures 906 are completely filled with a dielectric material such as epoxy, which is cured if necessary. The dielectric material is drilled to re-form via apertures 906 therein. As a result, via apertures 906 are slightly reduced in diameter as compared to the embodiment illustrated in FIG. 9 and have dielectric sidewalls 906S as compared to electrically conductive sidewalls 906S in FIG. 9.

In one embodiment, dielectric material is also apply to upper surface 502U and/or lower surface 502L of stiffener 502A to allow formation of electrically conductive structures, e.g., terminals, thereon electrically isolated from stiffener core 904.

From apply dielectric material to via aperture sidewalls operation 804, flow moves to an apply electrically conductive material to via aperture sidewalls operation 806. In apply electrically conductive material to via aperture sidewalls operation 806, an electrically conductive material 608A, e.g., copper, is applied, e.g., by plating, to via aperture sidewalls 906S to cause via aperture sidewalls 906S to become conductive, yet electrically isolated by dielectric material 1007 from stiffener core 904.

Referring now to FIGS. 8 and 12 together, from apply electrically conductive material to via aperture sidewalls operation 806, flow moves, optionally, to a form electronic component opening operation 808. In form electronic component opening operation 808, an electronic component opening 710A is formed, e.g., by punching, in stiffener core 904. As shown in FIG. 12, electronic component opening 710A extends entirely through stiffener 502A from upper surface 502U to lower surface 502L. Accordingly, stiffener 502A includes via apertures 906 having electrically conductive via aperture sidewalls 906S and electronic component opening 710A.

As discussed further below, in an alternative wirebond configuration, stiffener 502A is formed without electronic component opening 710A. In accordance with the wirebond configuration, form electronic component opening operation 808 is not performed and thus is an optional operation.

In the following discussion and subsequent figures, stiffener 502 of FIG. 7 is illustrated for simplicity. However, it is to be understood that stiffener 502A of FIG. 12 is used instead of stiffener 502 of FIG. 7 in other embodiments. Accordingly, the discussion of stiffener 502 of FIG. 7 is equally applicable to stiffener 502A of FIG. 12.

Figure 13:
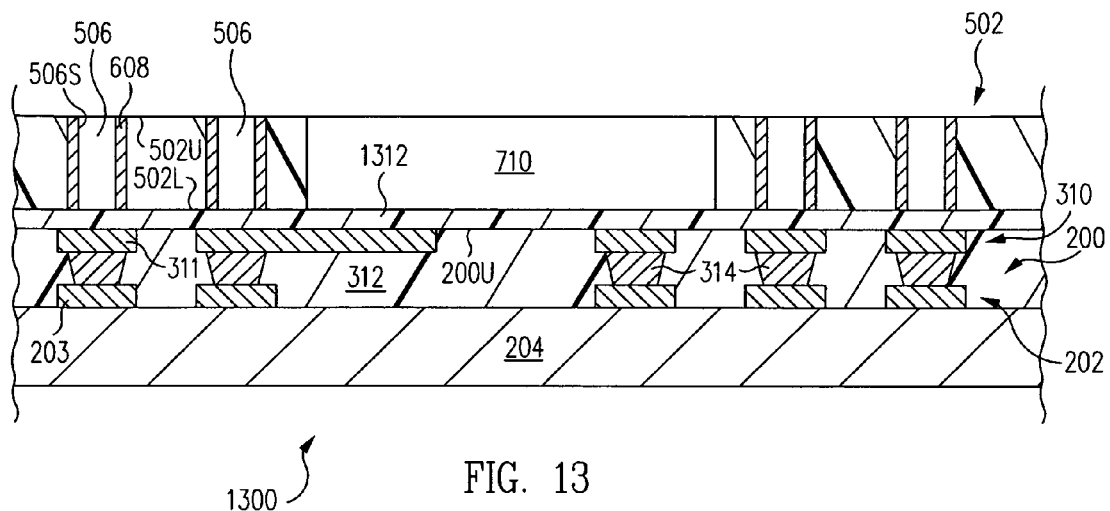
FIG. 13 is a cross-sectional view of a partial cavity flip chip package during fabrication in accordance with one embodiment.

FIG. 13 is a cross-sectional view of a partial cavity flip chip package 1300 during fabrication in accordance with one embodiment. Referring now to FIGS. 1 and 13 together, from form two circuit pattern substrate layer on carrier operation 104 and form stiffener operation 106, flow moves to an attach stiffener to substrate layer with stiffener attachment layer operation 108. In attach stiffener to substrate layer with stiffener attachment layer operation 108, stiffener 502 is attached to substrate layer 200 by a stiffener attachment layer 1312. More particularly, lower surface 502L of stiffener 502 is attached to upper surface 200U of substrate layer 200 by stiffener attachment layer 1312.

Stiffener attachment layer 1312 is a dielectric adhesive material. Accordingly, lower surface 502L of stiffener 502 is electrically isolated from upper surface 200U of substrate layer 200 by stiffener attachment layer 1312.

Stiffener 502 is attached to substrate layer 200 such that via apertures 506 are aligned with respective terminals 311 of upper circuit pattern 310. Stated another way, stiffener 502 is attached to substrate layer 200 such that via apertures 506 are directly opposite respective terminals 311 of upper circuit pattern 310 with stiffener attachment layer 1312 therebetween.

Figure 14:
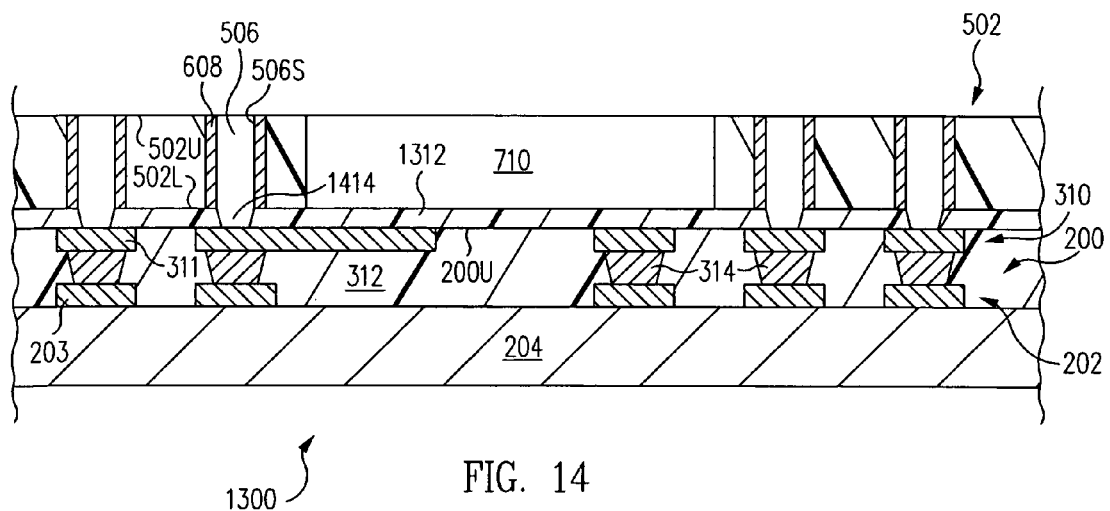
FIGS. 14, 15, 16, 17 and 18 are cross-sectional views of the partial cavity flip chip package of FIG. 13 at further stages during fabrication in accordance with various embodiments.

FIGS. 14, 15, 16, 17 and 18 are cross-sectional views of partial cavity flip chip package 1300 of FIG. 13 at further stages during fabrication in accordance with various embodiments. Referring now to FIGS. 1 and 14 together, from attach stiffener to substrate layer with stiffener attachment layer operation 108, flow moves to a form via apertures in stiffener attachment layer to expose upper circuit pattern terminals operation 110.

In form via apertures in stiffener attachment layer to expose upper circuit pattern terminals operation 110, via apertures 1414 are formed in stiffener attachment layer 1312 to expose terminals 311 of upper circuit pattern 310. In one embodiment, via apertures 1414 are formed using laser-ablation, i.e., by directing a laser through via apertures 506 and at the exposed portions of stiffener attachment layer 1312 exposed through via apertures 506.

Figure 15:
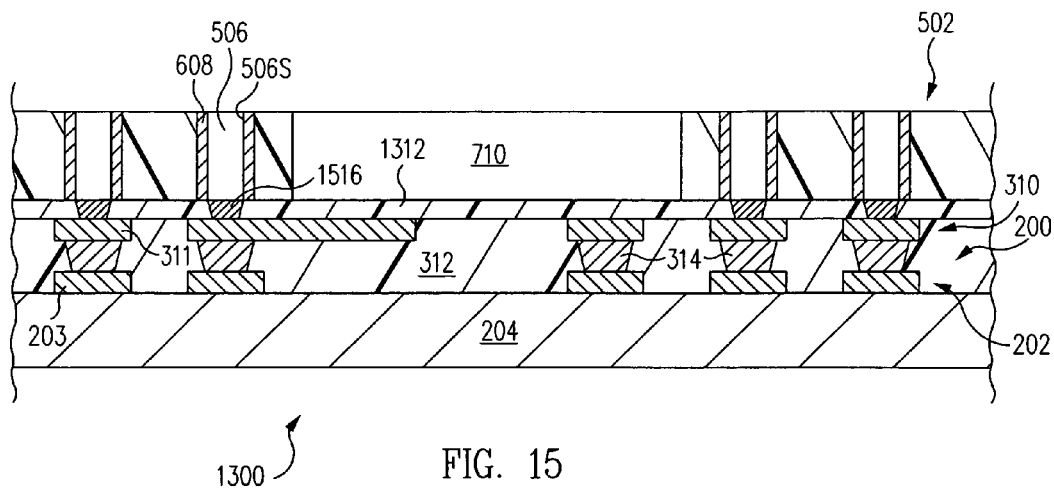

Referring now to FIGS. 1, 14 and 15 together, from form via apertures in stiffener attachment layer to expose upper circuit pattern terminals operation 110, flow moves to a fill via apertures in stiffener attachment layer operation 112. In fill via apertures in stiffener attachment layer operation 112, via apertures 1414 (FIG. 14) in stiffener attachment layer 1312 are filled with an electrically conductive material to form electrically conductive vias 1516 (FIG. 15).

Vias 1516 electrically connect electrically conductive via aperture sidewalls 506S with terminals 311 of upper circuit pattern 310.

Figure 16:
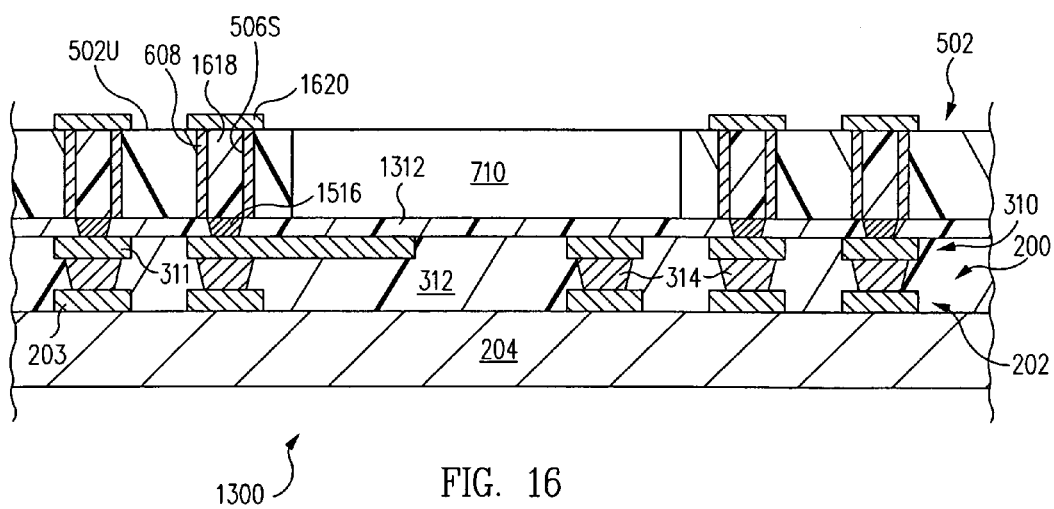

Referring now to FIGS. 1, 15 and 16 together, from fill via apertures in stiffener attachment layer operation 112, flow moves to a fill stiffener via apertures operation 114. In fill stiffener via apertures operation 114, via apertures 506 of stiffener 502 are filled with a via aperture filling material 1618. In one embodiment, via aperture filling material 1618 is a nonconductive paste (NCP). The nonconductive paste is cured, if necessary.

From fill stiffener via apertures operation 114, flow moves to a form terminals on stiffener operation 116. In form terminals on stiffener operation 116, stiffener terminals 1620 are formed on upper surface 502U of stiffener 502.

Stiffener terminals 1620, e.g., copper, are formed directly above via aperture filling material 1618 and electrically conductive via aperture sidewalls 506S. More particularly, stiffener terminals 1620 directly contact and are electrically connected to via aperture sidewalls 506S.

In another embodiment, fill stiffener via apertures operation 114 and form terminals on stiffener operation 116 are performed simultaneously in a single operation. For example, copper is plated to fill via apertures 506 and form stiffener terminals 1620 in a single plating operation. In accordance with this embodiment, via aperture filling material 1618 is plated copper, i.e., an electrically conductive material.

Figure 17:
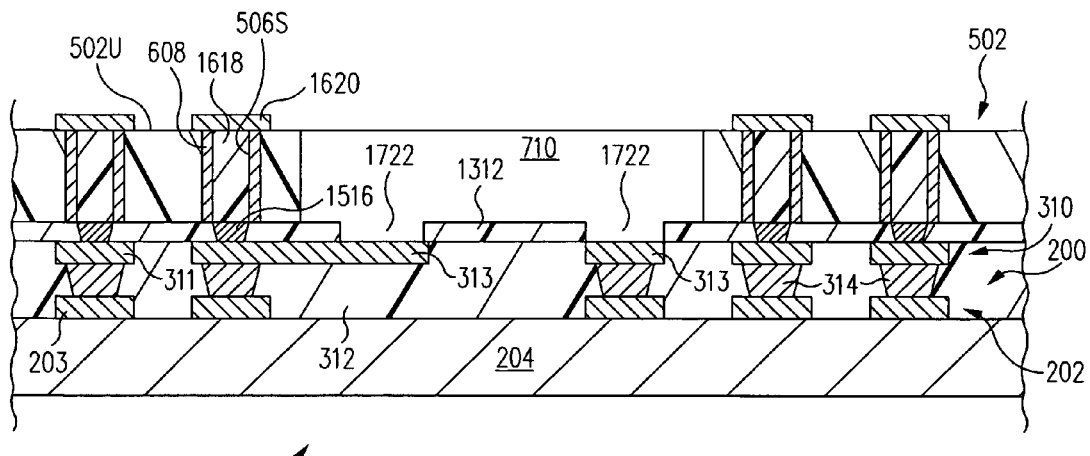

Referring now to FIGS. 1 and 17 together, from form terminals on stiffener operation 116, flow moves to a form via apertures in stiffener attachment layer to expose bump pads of upper circuit pattern operation 118. In form via apertures in stiffener attachment layer to expose bump pads of upper circuit pattern operation 118, via apertures 1722 are formed in stiffener attachment layer 1312 to expose bump pads 313 of upper circuit pattern 310. In one embodiment, via aperture 1722 are formed using laser-ablation although other via forming techniques are used in other embodiments.

In one embodiment, partial cavity flip chip package 1300 is electrically tested, e.g., for open circuits and/or shorts, prior to die attach. In this manner, partial cavity flip chip package 1300 is determined to be a known good substrate prior to die attach.

Figure 18:
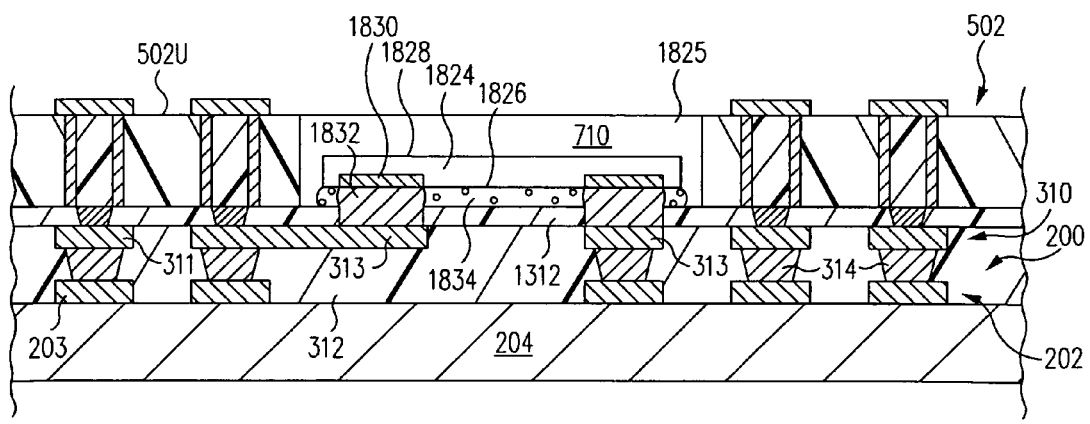

Referring now to FIGS. 1, 17 and 18 together, from form via apertures in stiffener attachment layer to expose bump pads of upper circuit pattern operation 118, flow moves to a flip chip die attach operation 120. In flip chip die attach operation 120, an electronic component 1824, e.g., an integrated circuit die, is flip chip attached to substrate layer 200 within electronic component opening 710 of stiffener 502.

Electronic component opening 710 of stiffener 502 and substrate layer 200 form a partial cavity 1825 in which electronic component 1824 is mounted. By mounting electronic component 1824 within partial cavity 1825, the height of partial cavity flip chip package 1300 is minimized as compared to mounting of electronic component 1824 on upper surface 502U of stiffener 502.

Electronic component 1824 can be an active component such as an integrated circuit die or a passive component such as a resistor, capacitor, or inductor. In one embodiment, electronic component 1824 is an integrated circuit die and includes an active surface 1826 and an opposite inactive surface 1828. Electronic component 1824 further includes bond pads 1830 on active surface 1826.

Bond pads 1830 are electrically and physically connected to bump pads 313 of upper circuit pattern 310 by flip chip bumps 1832, e.g., solder bumps, extending through via apertures 1722 (FIG. 17) in stiffener attachment layer 1312. In one embodiment, an underfill material 1834 is applied between active surface 1826 and stiffener attachment layer 1312 and around flip chip bumps 1832. Underfill material 1834 enhances the reliability of the flip chip mounting of electronic component 1824 to substrate layer 200.

Underfill material 1834 is optional, and in one embodiment, is not formed. For simplicity of presentation, underfill material 1834 is not illustrated in the following figures although it is to be understood that underfill material 1834 can be present depending upon the particular embodiment.

Figure 18A:
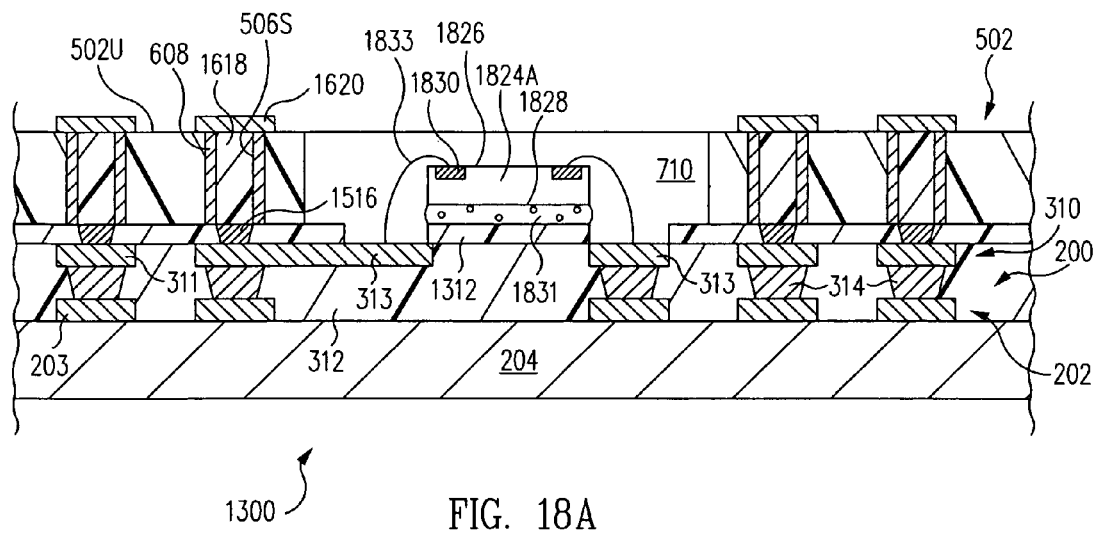
FIG. 18A is a cross-sectional view of the partial cavity flip chip package of FIG. 17 at a further stage during fabrication in accordance with another embodiment.

FIG. 18A is a cross-sectional view of partial cavity flip chip package 1300 of FIG. 17 at a further stage during fabrication in accordance with another embodiment. Referring now to FIGS. 1, 18 and 18A together, instead of flip chip attaching electronic component 1824 in flip chip die attach operation 120 as illustrated in FIG. 18, an electronic component 1824A is attached in a wirebond configuration and wire bonded as illustrated in FIG. 18A. More particularly, inactive surface 1828 of electronic component 1824A is attached to stiffener attachment layer 1312 with an adhesive 1831, sometimes called a die attach adhesive. Further, bond pads 1830 on active surface 1826 of electronic component 1824A are electrically connected to bump pads 313, sometimes called terminals, by bond wires 1833. Otherwise, processing continues in a manner similar to that described below.

Figure 19:
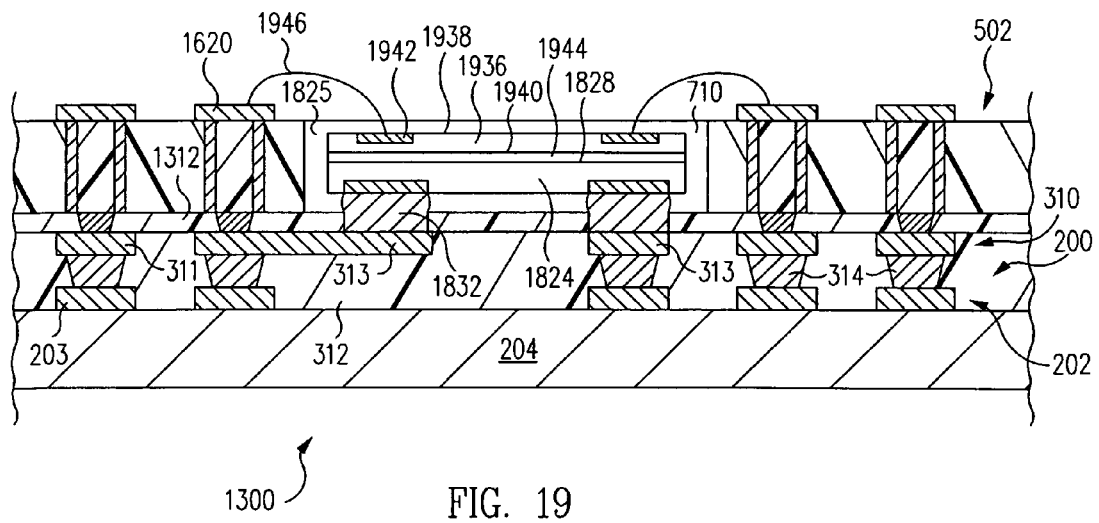
FIG. 19 is a cross-sectional view of the partial cavity flip chip package of FIG. 18 at a further stage during fabrication in accordance with one embodiment.

FIG. 19 is a cross-sectional view of partial cavity flip chip package 1300 of FIG. 18 at a further stage during fabrication in accordance with one embodiment. Referring now to FIGS. 1 and 19 together, from flip chip die attach operation 120, flow moves, optionally, to a stacked die attach operation 122. In stacked die attach operation 122, one or more electronic components are stacked on electronic component 1824. To illustrate, in the particular embodiment of FIG. 19, stacked on inactive surface 1828 of lower, e.g., first, electronic component 1824 is an upper, e.g., second, electronic component 1936.

Upper electronic component 1936 can be an active component such as an integrated circuit die or a passive component such as a resistor, capacitor, or inductor. In accordance with this embodiment, electronic component 1936 is an integrated circuit die and includes an active surface 1938 and an opposite inactive surface 1940. Upper electronic component 1936 further includes bond pads 1942 on active surface 1938.

Inactive surface 1940 of upper electronic component 1936 is mounted to inactive surface 1828 of electronic component 1824 by an adhesive 1944, sometimes called a die attach adhesive. Bond pads 1942 of upper electronic component 1936 are electrically connected to stiffener terminals 1620 by bond wires 1946. In accordance with this embodiment, upper electronic component 1936, sometimes called a stacked die, is stacked on lower electronic component 1824 in a wirebond configuration. However, in another embodiment, an upper electronic component is stacked on lower electronic component 1824 in a flip chip configuration such as that illustrated in FIG. 20.

Figure 20:
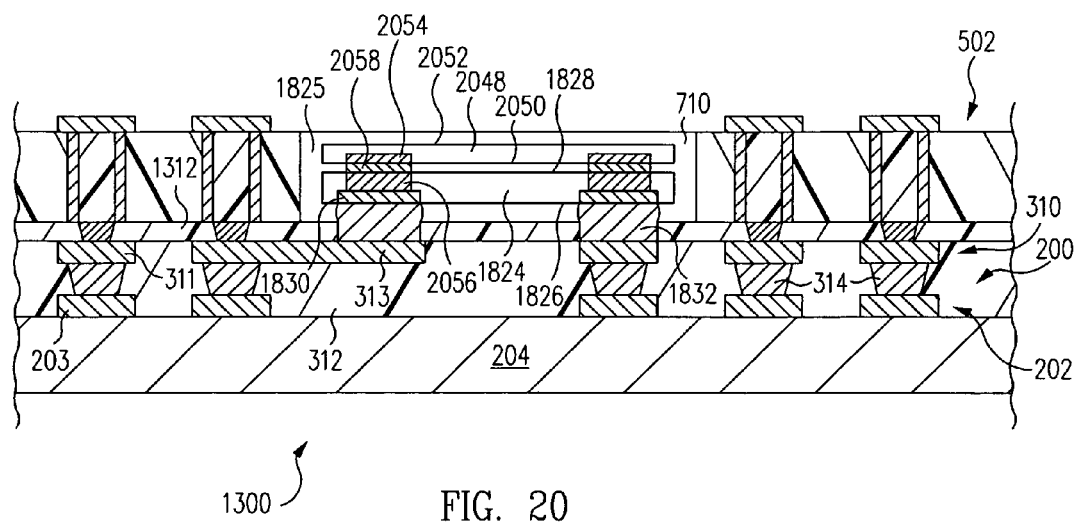
FIG. 20 is a cross-sectional view of the partial cavity flip chip package of FIG. 18 at a further stage during fabrication in accordance with another embodiment.

FIG. 20 is a cross-sectional view of partial cavity flip chip package 1300 of FIG. 18 at a further stage during fabrication in accordance with another embodiment. Referring now to FIGS. 1 and 20 together, in stacked die attach operation 122, one or more electronic components are stacked on electronic component 1824 in a flip chip configuration. To illustrate, in the particular embodiment of FIG. 20, stacked on inactive surface 1828 of lower electronic component 1824 is an upper, e.g., second, electronic component 2048.

Upper electronic component 2048 can be an active component such as an integrated circuit die or a passive component such as a resistor, capacitor, or inductor. In accordance with this embodiment, upper electronic component 2048 is an integrated circuit die and includes an active surface 2050 and an opposite inactive surface 2052. Upper electronic component 2048 further includes bond pads 2054 on active surface 2050.

In accordance with this embodiment, lower electronic component 1824 includes electrically conductive through silicon vias (TSVs) 2056. Through silicon vias 2056 form electrically conductive terminals on inactive surface 1828 of lower electronic component 1824.

Through silicon vias 2056 extend from inactive surface 1828 through lower electronic component 1824 and are electrically connected to bond pads 1830 or other electrically conductive terminals on active surface 1826 of lower electronic component 1824. In an alternative embodiment, electrically conductive traces extend from terminals on inactive surface 1828 around sides of lower electronic component 1824 and to bond pads 1830 or other terminals on active surface 1826.

In accordance with the embodiment illustrated in FIG. 20, bond pads 2054 of upper electronic component 2048 are electrically and physically connected to through silicon vias 2056 by flip chip bumps 2058, e.g., solder bumps. In accordance with this embodiment, upper electronic component 2048, sometimes called a stacked die, is stacked on lower electronic component 1824 in a flip chip configuration.

Stacked die attach operation 122 is optional, and in one embodiment, is not performed. Accordingly, although only lower electronic component 1824 is illustrated in partial cavity flip chip package 1300 in the figures which follow, in light of this disclosure, those of skill in the art will understand that partial cavity flip chip package 1300 can be fabricated with an electronic component stacked in a wirebond or flip chip configuration such as that illustrated in FIGS. 19 and 20, respectively.

Figure 21:
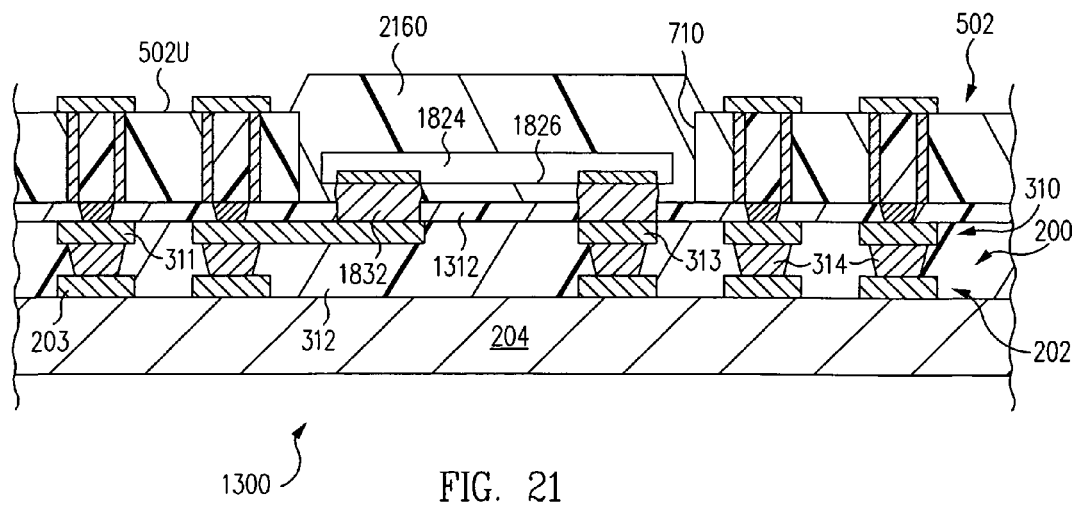
FIG. 21 is a cross-sectional view of the partial cavity flip chip package of FIG. 18 at a further stage during fabrication in accordance with yet another embodiment.

FIG. 21 is a cross-sectional view of partial cavity flip chip package 1300 of FIG. 18 at a further stage during fabrication in accordance with yet another embodiment. Referring now to FIGS. 1 and 21 together, from flip chip die attach operation 120 (or from stacked die attach operation 122 is performed), flow moves to an encase die in package body operation 124. In encase die in package body operation 124, electronic component 1824 (and any electronic components stacked thereon including bond wires) are encased in a package body 2160. More particularly, package body 2160 fills electronic component opening 710 of stiffener 502 and surrounds, i.e., encases, electronic component 1824. In one embodiment where an underfill material has not previously been applied between electronic component 1824 and stiffener attachment layer 1312, package body 2160 fills the region between active surface 1826 of electronic component 1824 and stiffener attachment layer 1312 and encloses flip chip bumps 1832.

Package body 2160 protects electronic component 1824 from the ambient environment as well as enhances the reliability of the mounting of electronic component 1824 by flip chip bumps 1832. In one embodiment, package body 2160 is applied as a liquid and cured, if necessary. In another embodiment, package body 2160 is formed by molding. In yet another embodiment, package body 2160 is formed of nonconductive paste (NCP).

Figure 22:
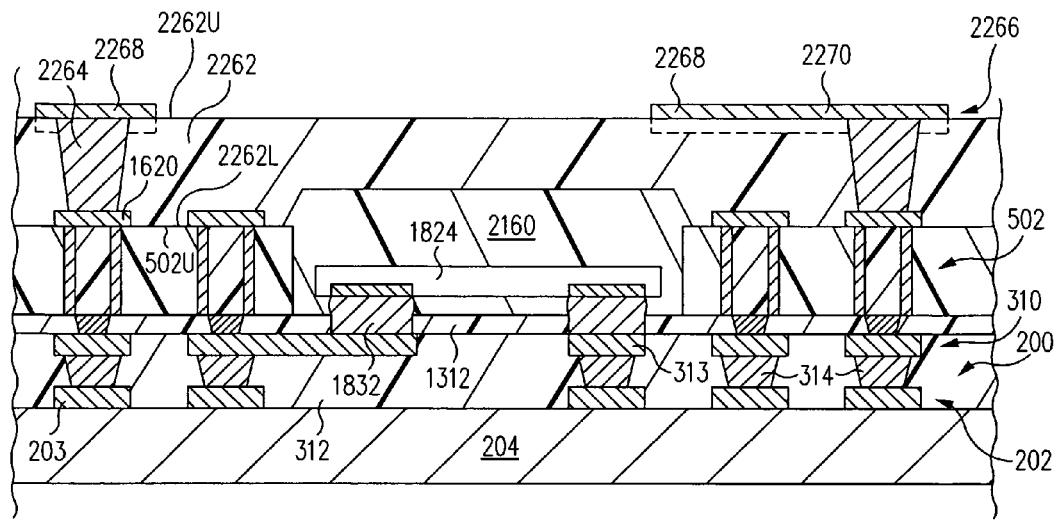
FIGS. 22, 23, 24 are cross-sectional views of the partial cavity flip chip package of FIG. 21 at further stages during fabrication in accordance with various embodiments.

FIG. 22 is a cross-sectional view of partial cavity flip chip package 1300 of FIG. 21 at a further stage during fabrication in accordance with one embodiment. Referring now to FIGS. 1 and 22 together, from encase die in package body operation 124, flow moves, optionally, to a buildup layer attach operation 126. In buildup layer attach operation 126, a lower, e.g., first, surface 2262L of a dielectric buildup layer 2262 is attached to upper surface 502U of stiffener 502 and package body 2160. In one embodiment, buildup layer 2262 is attached with a dielectric adhesive. In another embodiment, buildup layer 2262 includes an adhesive lower surface 2262L, e.g., is itself an adhesive, and self-adheres. Stated another way, buildup layer 2262 is laminated to upper surface 502U of stiffener 502 and package body 2160. In yet another embodiment, buildup layer 2262 is molding compound and is molded to upper surface 502U of stiffener 502 and package body 2160 and thus self-adheres.

From buildup layer attach operation 126, flow moves to a form vias in buildup layer operation 128. In form vias in buildup layer operation 128, via apertures are formed entirely through buildup layer 2262, e.g., using laser-ablation or mechanical drilling or other via aperture formation technique. More particularly, the via apertures extend from an upper, e.g., second, surface 2262U of buildup layer 2262 through buildup layer 2262 to lower surface 2262L and expose stiffener terminals 1620.

The via apertures are then filled with an electrically conductive material, e.g., plated copper and/or an electrically conductive paste, to form electrically conductive vias 2264. Vias 2264 are electrically connected to stiffener terminals 1620. Further, vias 2264 extend entirely through buildup layer 2262 between upper surface 2262U and lower surface 2262L.

From form vias in buildup layer operation 128, flow moves to a form outer circuit pattern operation 130. In form outer circuit pattern operation 130, an outer circuit pattern 2266 is formed on or embedded within, i.e., coupled to, upper surface 2262U of buildup layer 2262. Illustratively, outer circuit pattern 2266 includes a plurality of terminals 2268, sometimes called lands, traces 2270, and/or other electrically conductive features. Outer circuit pattern 2266 is electrically connected to vias 2264. Outer circuit pattern 2266 provides terminals 2268 for mounting of additional electronic components and/or packages on partial cavity flip chip package 1300. Further, outer circuit pattern 2266 provides traces 2270 for redistributing the pattern of stiffener terminals 1620 to the pattern of terminals 2268.

In one embodiment, an electrically conductive material, e.g., copper, is applied to upper surface 2262U of buildup layer 2262. The electrically conductive material is selectively etched to form outer circuit pattern 2266.

In another embodiment, an electrically conductive material, e.g., copper is selectively applied to upper surface 2262U of buildup layer 2262 to form outer circuit pattern 2266. For example, a photoresist or other masking material is applied to upper surface 2262U and patterned, e.g., using photo imaging or laser ablation techniques, to form a patterned mask having removed portions forming a positive image of outer circuit pattern 2266. Outer circuit pattern 2266 is formed, e.g., by plating or screening electrically conductive material. The patterned mask is then removed.

In yet another embodiment, during the laser-ablation of the via apertures in which vias 2264 are formed, a positive image of outer circuit pattern 2266 is laser-ablated into upper surface 2262U of buildup layer 2262. Outer circuit pattern 2266 is formed simultaneously with vias 2264, e.g., during a single plating operation. In accordance with this embodiment, outer circuit pattern 2266 is embedded within buildup layer 2262 inward of upper surface 2262U of buildup layer 2262 as indicated by the dashed lines in FIG. 22.

As set forth above, buildup layer attach operation 126, form vias in buildup layer operation 128, and form outer circuit pattern operation 130 are optional, and in one embodiment, are not performed. Accordingly, although buildup layer 2262, vias 2264, and outer circuit pattern 2266 are not illustrated in FIGS. 24, 25 for simplicity, in light of this disclosure, those of skill in the art will understand that partial cavity flip chip package 1300 can be fabricated with buildup layer 2262, vias 2264, and outer circuit pattern 2266 in other embodiments.

Figure 23:
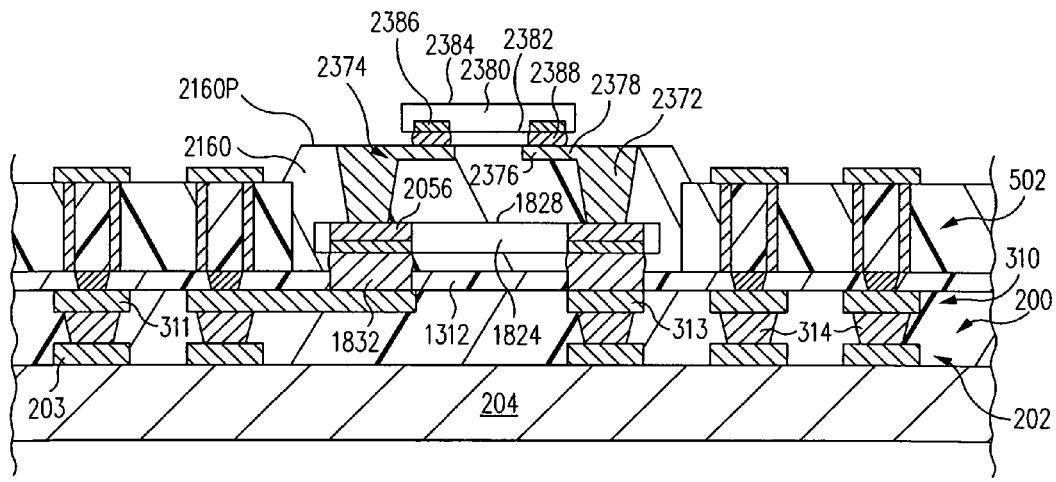

FIG. 23 is a cross-sectional view of partial cavity flip chip package 1300 of FIG. 21 at a further stage during fabrication in accordance with another embodiment. Referring now to FIGS. 1 and 23 together, from encase die in package body operation 124, flow moves, optionally, to a form vias in package body operation 132. In form vias in package body operation 132, via apertures are formed entirely through package body 2160, e.g., using laser ablation or mechanical drilling or other via aperture formation technique. More particularly, the via apertures extend from a primary surface 2160P of package body 2160 through package body 2160 to inactive surface 1828 of electronic component 1824 and expose through silicon vias 2056. Recall that through silicon vias 2056 were discussed above in detail in reference to FIG. 20.

The via apertures are then filled with an electrically conductive material, e.g., plated copper and/or an electrically conductive paste, to form electrically conductive vias 2372. Vias 2372 are electrically connected to through silicon vias 2056. Further, vias 2372 extend entirely through package body 2160 between primary surface 2160P and inactive surface 1828 of electronic component 1824.

From form vias in package body operation 132, flow moves to a form outer circuit pattern operation 134. In form outer circuit pattern operation 134, an outer circuit pattern 2374 is formed on or embedded within, i.e., coupled to, primary surface 2160P of package body 2160. Illustratively, outer circuit pattern 2374 includes a plurality of terminals 2376, sometimes called lands, traces 2378, and/or other electrically conductive features. Outer circuit pattern 2374 is electrically connected to vias 2372. Outer circuit pattern 2374 provides terminals 2376 for mounting of additional electronic components and/or packages on partial cavity flip chip package 1300. Further, outer circuit pattern 2374 provides traces 2378 for redistributing the pattern of through silicon vias 2056 to the pattern of terminals 2376.

In one embodiment, an electrically conductive material, e.g., copper, is applied to primary surface 2160P of package body 2160. The electrically conductive material is selectively etched to form outer circuit pattern 2374.

In another embodiment, an electrically conductive material, e.g., copper, is selectively applied to primary surface 2160P of package body 2160 to form outer circuit pattern 2374. For example, a photoresist or other masking material is applied to primary surface 2160P and patterned, e.g., using photo imaging or laser ablation techniques, to form a patterned mask having removed portions forming a positive image of outer circuit pattern 2374. Outer circuit pattern 2374 is formed, e.g., by plating or screening electrically conductive material. The patterned mask is then removed.

In yet another embodiment, during the laser-ablation of the via apertures in which vias 2372 are formed, a positive image of outer circuit pattern 2374 is laser-ablated into primary surface 2160P of package body 2160. Outer circuit pattern 2374 is formed simultaneously with vias 2372, e.g., during a single plating operation. In accordance with this embodiment, outer circuit pattern 2374 is embedded within package body 2160 inward of primary surface 2160P of package body 2160 as illustrated in FIG. 23.

From form outer circuit pattern operation 134, flow moves to a stacked die attach operation 136. In stacked die attach operation 136, an upper, e.g., second, electronic component 2380 is mounted to outer circuit pattern 2374. Upper electronic component 2380 can be an active component such as an integrated circuit die, a passive component such as a resistor, capacitor, or inductor, or another electronic component package. In accordance with this embodiment, upper electronic component 2380 is an integrated circuit die and includes an active surface 2382 and an opposite inactive surface 2384. Upper electronic component 2380 further includes bond pads 2386 on active surface 2382.

Bond pads 2386 are electrically and physically connected to terminals 2376 of outer circuit pattern 2374 by flip chip bumps 2388, e.g., solder bumps. In accordance with this embodiment, upper electronic component 2380, sometimes called a stacked die, is stacked on outer circuit pattern 2374 in a flip chip configuration. However, in light of this disclosure, those of skill in the art will understand that electronic components can be stacked in other mounting configurations, e.g., a wirebond configuration, in other embodiments.

As set forth above, form vias in package body operation 132, form outer circuit pattern operation 134, and stacked die attach operation 136 are optional, and in one embodiment, are not performed. Accordingly, although vias 2372, outer circuit pattern 2374, upper electronic component 2380 and flip chip bumps 2388 are not illustrated in FIGS. 24, 25 for simplicity, in light of this disclosure, those of skill in the art will understand that partial cavity flip chip package 1300 can be fabricated with vias 2372, outer circuit pattern 2374, upper electronic component 2380 and flip chip bumps 2388 in other embodiments.

Figure 24:
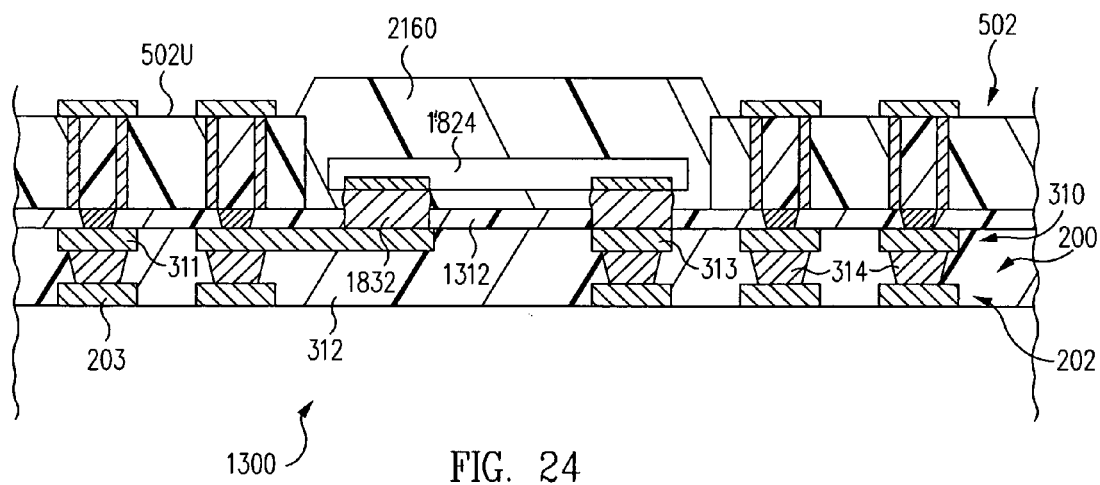

FIG. 24 is a cross-sectional view of partial cavity flip chip package 1300 of FIG. 21 at a further stage during fabrication in accordance with another embodiment. Referring now to FIGS. 1, 21 and 24 together, from encase die in package body operation 124 (or from form outer circuit pattern operation 130 in the event that operations 126, 128, 130 are performed or from stacked die attach operation 136 in the event that operations 132, 134, 136 are performed), flow moves to a remove carrier operation 138.

In remove carrier operation 138, carrier 204 (FIG. 21) is removed, e.g., by etching. In one embodiment, carrier 204 is formed of a metal that is selectively etchable as compared to lower circuit pattern 202. Accordingly, carrier 204 is etched until lower circuit pattern 202 is exposed, which is the end point of the etch process. However, in other embodiments, carrier 204 is removed by peeling, mechanical grinding, or other removal technique.

Figure 25:
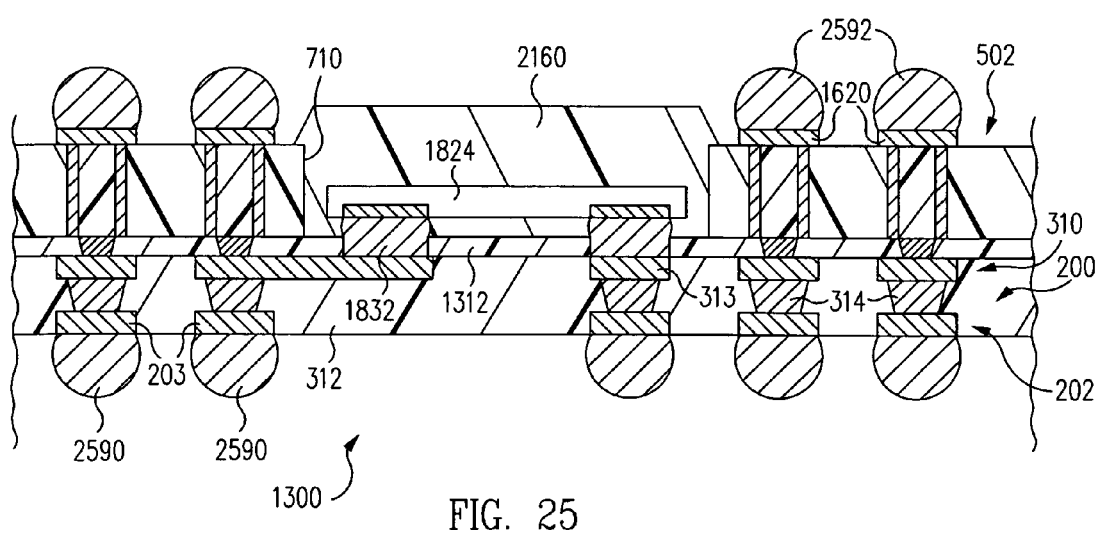
FIG. 25 is a cross-sectional view of the partial cavity flip chip package of FIG. 24 at a further stage during fabrication in accordance with one embodiment.

FIG. 25 is a cross-sectional view of partial cavity flip chip package 1300 of FIG. 24 at a further stage during fabrication in accordance with one embodiment. Referring now to FIGS. 1 and 25 together, from remove carrier operation 138, flow moves, optionally, to a form interconnection balls operation 140. In form interconnection balls operation 140, lower interconnection balls 2590, e.g., a ball grid array, are formed on terminals 203 of lower circuit pattern 202. Interconnection balls 2590, e.g., solder balls, are used to electrically interconnect partial cavity flip chip package 1300 with other electrically conductive structures such as a printed circuit motherboard or other larger substrate.

In accordance with one embodiment, upper interconnection balls 2592, e.g., solder balls, are formed on stiffener terminals 1620 in form interconnection balls operation 140. Interconnection balls 2592 are used to electrically interconnect other electronic components and/or packages to partial cavity flip chip package 1300.

In one embodiment, both lower interconnection balls 2590 and upper interconnection balls 2592 are formed in form interconnection balls operation 140. In another embodiment, only lower interconnection balls 2590 or upper interconnection balls 2592 are formed in form interconnection balls operation 140. In yet another embodiment, form interconnection balls operation 140 is not performed, and so is an optional operation.

As illustrated in FIG. 25, partial cavity flip chip package 1300 is relatively thin. More particularly, electronic component 1824 is located within electronic component opening 710 of stiffener 502 thus minimizing the height of partial cavity flip chip package 1300. Further, stiffener 502 adds rigidity and strength to partial cavity flip chip package 1300 minimizing undesirable bending of partial cavity flip chip package 1300. Accordingly, the reliability of electrical interconnections formed with partial cavity flip chip package 1300 is maximized. Further, stiffener 502 acts as an internal heat sink thus maximizing heat dissipation from partial cavity flip chip package 1300.

Figure 26:
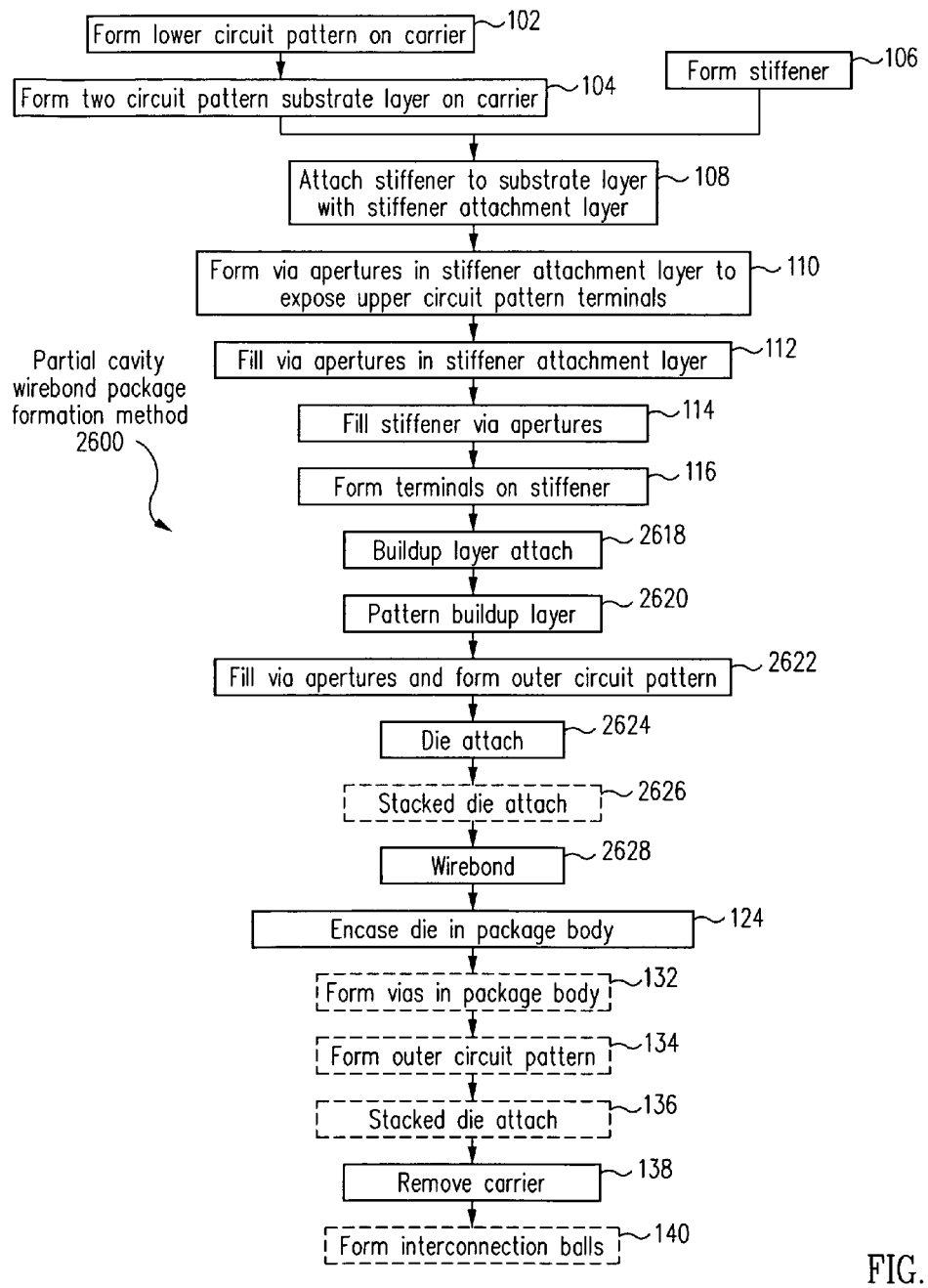
FIG. 26 is a flow diagram of a partial cavity wirebond package formation method in accordance with another embodiment.

FIG. 26 is a flow diagram of a partial cavity wirebond package formation method 2600 in accordance with another embodiment. Operations 102, 104, 106, 108, 110, 112, 114, 116 of partial cavity wirebond package formation method 2600 of FIG. 26 are identical or substantially similar to operations 102, 104, 106, 108, 110, 112, 114, 116 of partial cavity flip chip package formation method 100 of FIG. 1, respectively, and so are not repeated for clarity of presentation. In accordance with this embodiment, referring to FIGS. 4 and 7 together, form electronic component opening operation 406 is not performed and so stiffener 502 is formed without an electronic component opening as illustrated in FIG. 27.

Figure 27:
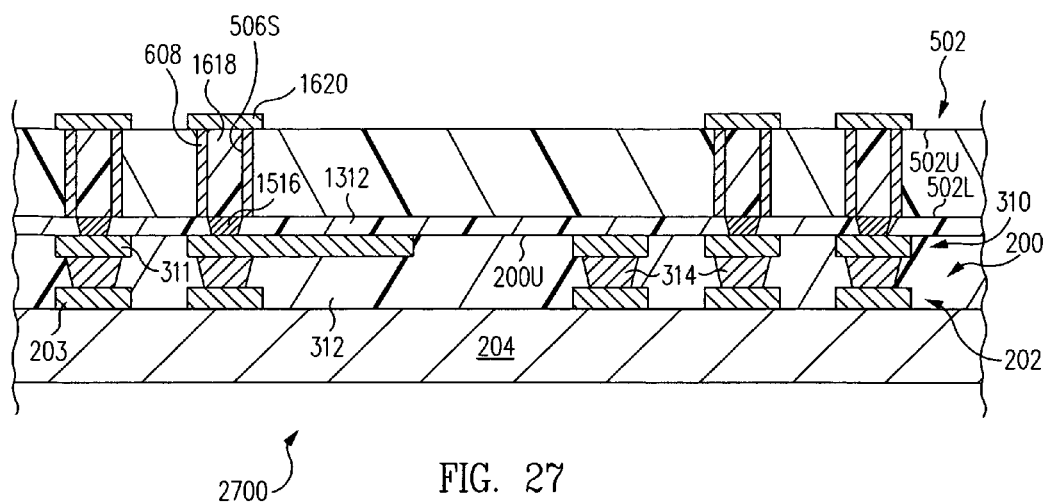
FIG. 27 is a cross-sectional view of a partial cavity wirebond package in accordance with one embodiment.
Figure 28:
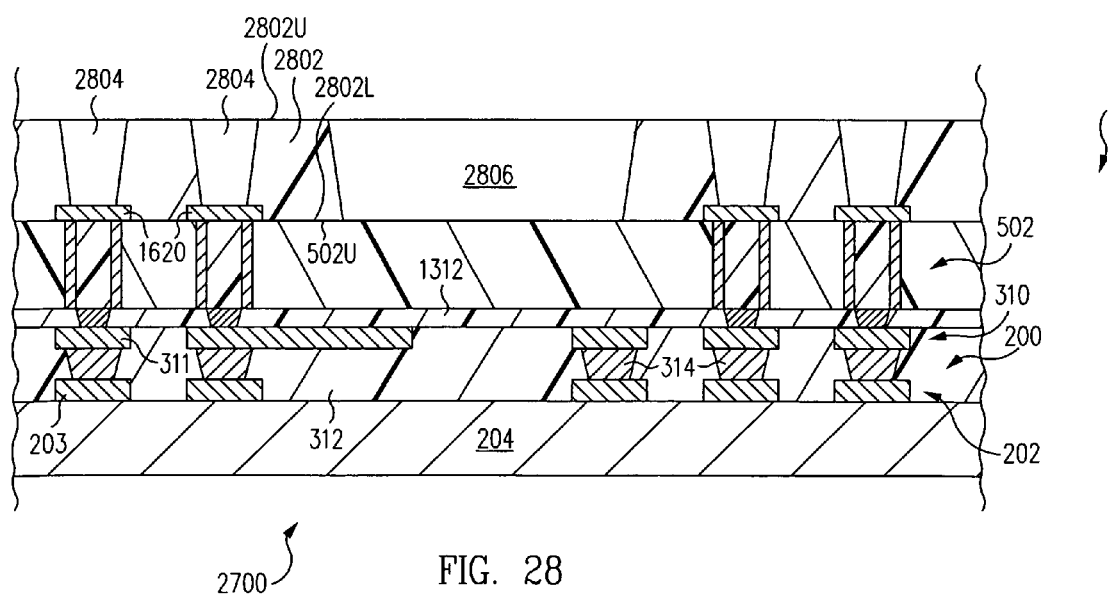
FIGS. 28, 29, 30 are cross-sectional views of the partial cavity wirebond package of FIG. 27 at further stages during fabrication in accordance with various embodiments.

FIG. 27 is a cross-sectional view of a partial cavity wirebond package 2700 in accordance with one embodiment. FIG. 28 is a cross-sectional view of partial cavity wirebond package 2700 of FIG. 27 at a further stage during fabrication in accordance with one embodiment.

Referring now to FIGS. 26, 27 and 28 together, from form terminals on stiffener operation 116, flow moves to a buildup layer attach operation 2618. In buildup layer attach operation 2618, a lower, e.g., first, surface 2802L of a dielectric buildup layer 2802 is attached to upper surface 502U of stiffener 502.

In one embodiment, buildup layer 2802 is attached with a dielectric adhesive. In another embodiment, buildup layer 2802 includes an adhesive lower surface 2802L, e.g., is itself an adhesive, and self-adheres. Stated another way, buildup layer 2802 is laminated to upper surface 502U of stiffener 502. In yet another embodiment, buildup layer 2802 is molding compound and is molded to upper surface 502U of stiffener 502 and thus self-adheres.

From buildup layer attach operation 2618, flow moves to a pattern buildup layer operation 2620. In pattern buildup layer operation 2620, buildup layer 2802 is patterned. More particularly, buildup layer 2802 is drilled to form via apertures 2804 therein. Via apertures 2804 are formed entirely through buildup layer 2802 and extend between an upper, e.g., second, surface 2802U and lower surface 2802L of buildup layer 2802. Via apertures 2804 expose stiffener terminals 1620. Via apertures 2804 are formed by laser-ablation, mechanical drilling or other via aperture formation technique.

Further, an electronic component opening 2806 is formed in buildup layer 2802. As shown in FIG. 28, electronic component opening 2806 extends entirely through buildup layer 2802 from upper surface 2802U to lower surface 2802L and exposes upper surface 502U of stiffener 502.

Figure 29:
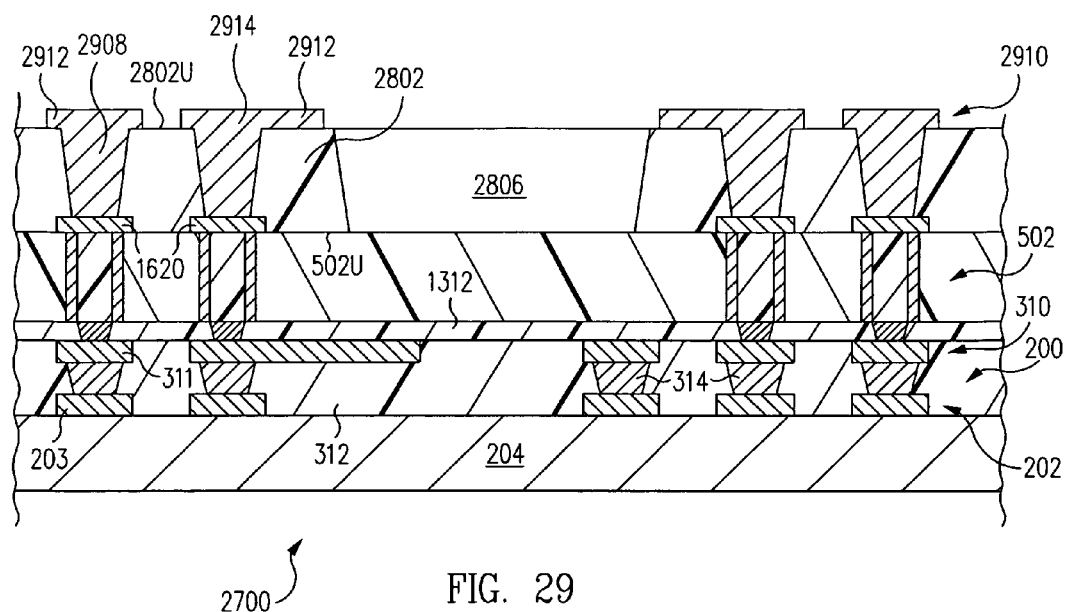

FIG. 29 is a cross-sectional view of partial cavity wirebond package 2700 of FIG. 28 at a further stage during fabrication in accordance with one embodiment. Referring now to FIGS. 26, 28 and 29 together, from pattern buildup layer operation 2620, flow moves to a fill via apertures and form outer circuit pattern operation 2622. In fill via apertures and form outer circuit pattern operation 2622, via apertures 2804 are filled with an electrically conductive material to form electrically conductive vias 2908. Further, an outer circuit pattern 2910 is formed in fill via apertures and form outer circuit pattern operation 2622.

Outer circuit pattern 2910 is formed on or embedded within upper surface 2802U of buildup layer 2802. Illustratively, outer circuit pattern 2910 includes a plurality of terminals 2912, sometimes called lands, traces 2914, and/or other electrically conductive features. Outer circuit pattern 2910 is electrically connected to vias 2908. Outer circuit pattern 2910 provides terminals 2912 for mounting of additional electronic components and/or packages on partial cavity wirebond package 2700. Further, outer circuit pattern 2910 provides traces 2914 for redistributing the pattern of stiffener terminals 1620 to the pattern of terminals 2912.

In one embodiment, an electrically conductive material, e.g., copper, fills via apertures 2804 and is applied to upper surface 2802U of buildup layer 2802. The electrically conductive material is selectively etched to form outer circuit pattern 2910.

In another embodiment, an electrically conductive material, e.g., copper is selectively applied to upper surface 2802U of buildup layer 2802 to form outer circuit pattern 2910. For example, a photoresist or other masking material is applied to upper surface 2802U and patterned, e.g., using photo imaging or laser ablation techniques, to form a patterned mask having removed portions forming a positive image of outer circuit pattern 2910. Outer circuit pattern 2910 is formed, e.g., by plating or screening electrically conductive material. The patterned mask is then removed.

In yet another embodiment, during the laser-ablation of via apertures 2804 in which vias 2908 are formed, a positive image of outer circuit pattern 2910 is laser-ablated into upper surface 2802U of buildup layer 2802. Outer circuit pattern 2910 is formed simultaneously with vias 2908, e.g., during a single plating operation. In accordance with this embodiment, outer circuit pattern 2910 is embedded within buildup layer 2802 inward of upper surface 2802U of buildup layer 2802.

In one embodiment, partial cavity wirebond package 2700 is electrically tested, e.g., for open circuits and/or shorts, prior to die attach. In this manner, partial cavity wirebond package 2700 is determined to be a known good substrate prior to die attach.

Figure 30:
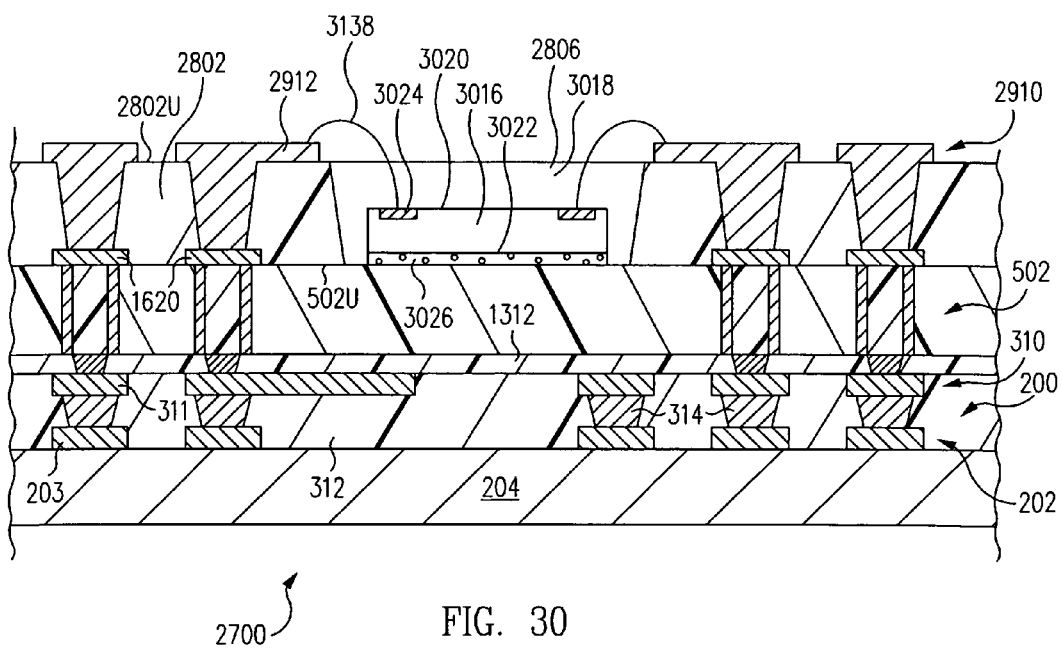

FIG. 30 is a cross-sectional view of partial cavity wirebond package 2700 of FIG. 29 at a further stage during fabrication in accordance with one embodiment. Referring now to FIGS. 26 and 30 together, from fill via apertures and form outer circuit pattern operation 2622, flow moves to a die attach operation 2624. In die attach operation 2624, an electronic component 3016, e.g., an integrated circuit die, is attached to upper surface 502U of stiffener 502 and within electronic component opening 2806 of buildup layer 2802.

Electronic component opening 2806 of buildup layer 2802 and stiffener 502 form a partial cavity 3018 in which electronic component 3016 is mounted. By mounting electronic component 3016 within partial cavity 3018, the height of partial cavity wirebond package 2700 is minimized as compared to mounting of electronic component 3016 on upper surface 2802U of buildup layer 2802.

Electronic component 3016 can be an active component such as an integrated circuit die or a passive component such as a resistor, capacitor, or inductor. In one embodiment, electronic component 3016 is an integrated circuit die and includes an active surface 3020 and an opposite inactive surface 3022. Electronic component 3016 further includes bond pads 3024 on active surface 3020.

Inactive surface 3022 is physically attached to upper surface 502U of stiffener 502 by an adhesive 3026, sometimes called a die attach adhesive.

Figure 31:
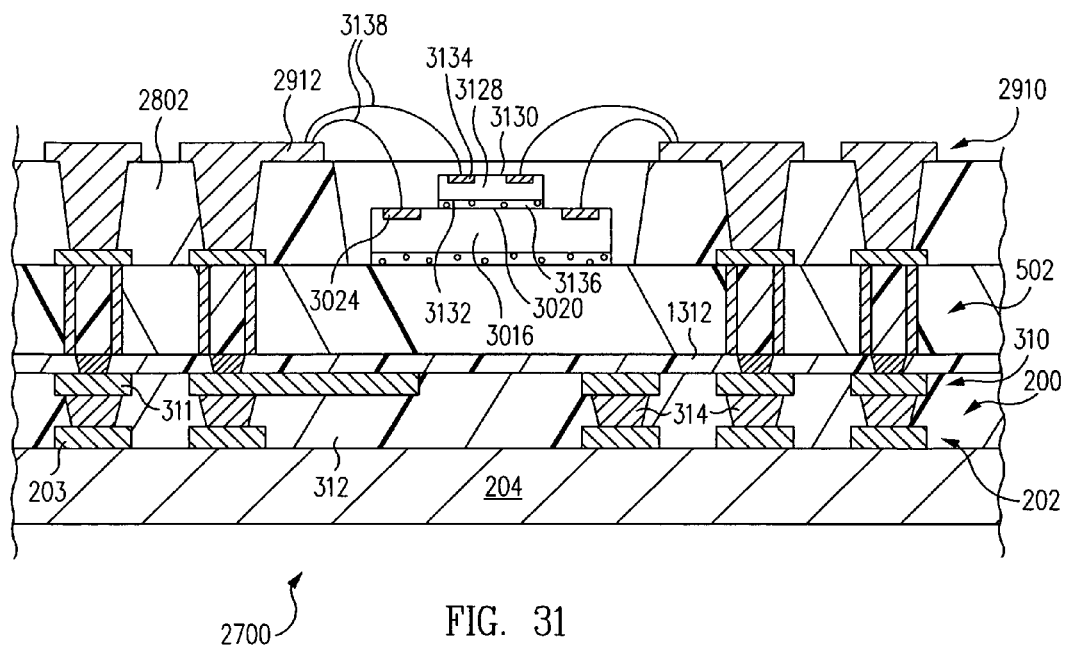
FIGS. 31, 32, 33 are cross-sectional views of the partial cavity wirebond package of FIG. 30 at further stages during fabrication in accordance with various embodiments.

FIG. 31 is a cross-sectional view of partial cavity wirebond package 2700 of FIG. 30 at a further stage during fabrication in accordance with one embodiment. Referring now to FIGS. 26 and 31 together, from die attach operation 2624, flow moves, optionally, to a stacked die attach operation 2626. In stacked die attach operation 2626, one or more electronic components are stacked on electronic component 3016. To illustrate, in the particular embodiment of FIG. 31, stacked on active surface 3020 of lower, e.g., first, electronic component 3016 is an upper, e.g., second, electronic component 3128.

Upper electronic component 3128 can be an active component such as an integrated circuit die or a passive component such as a resistor, capacitor, or inductor. In accordance with this embodiment, upper electronic component 3128 is an integrated circuit die and includes an active surface 3130 and an opposite inactive surface 3132. Upper electronic component 3128 further includes bond pads 3134 on active surface 3130.

Inactive surface 3132 of upper electronic component 3128 is mounted to active surface 3020 of lower electronic component 3016 by an adhesive 3136, sometimes called a die attach adhesive.

From stacked die attach operation 2626, flow moves to a wirebond operation 2628. In wirebond operation 2628, bond pads 3024 of lower electronic component 3016 and bond pads 3134 of upper electronic component 3128 are electrically connected to terminals 2912 of outer circuit pattern 2910 by bond wires 3138. In accordance with this embodiment, upper electronic component 3128, sometimes called a stacked die, is stacked on lower electronic component 3016 in a wirebond configuration. However, in another embodiment, an upper electronic component is stacked on lower electronic component 3016 in a flip chip configuration such as that illustrated in FIG. 32.

Figure 32:
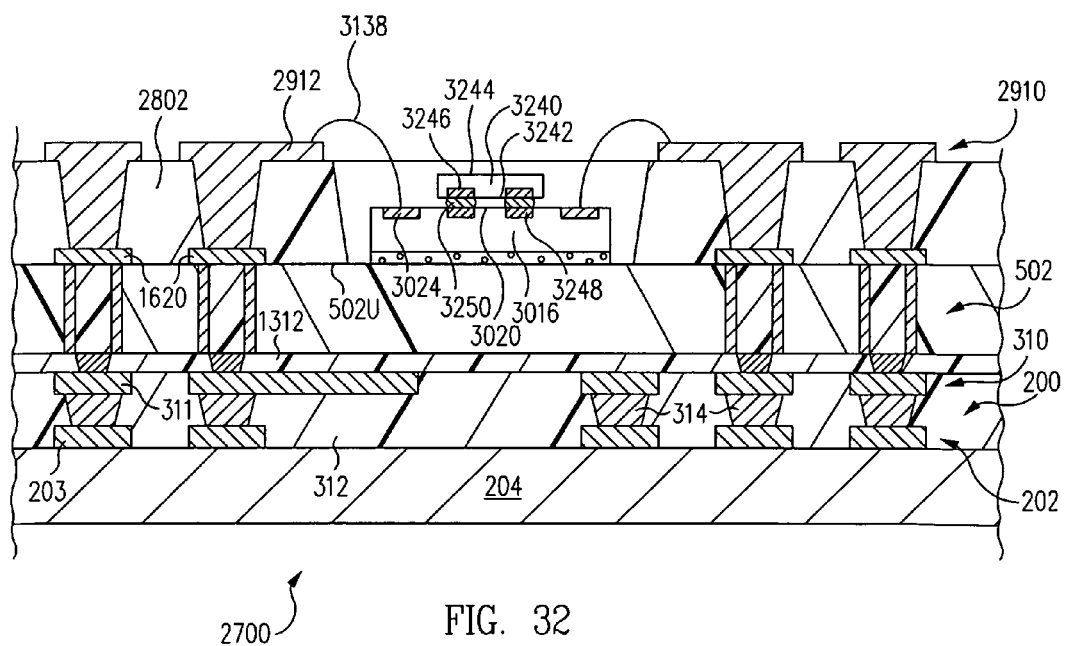

FIG. 32 is a cross-sectional view of partial cavity wirebond package 2700 of FIG. 30 at a further stage during fabrication in accordance with another embodiment. Referring now to FIGS. 26 and 32 together, in stacked die attach operation 2626, one or more electronic components are stacked on lower electronic component 3016 in a flip chip configuration, sometimes called a face-to-face configuration. To illustrate, in the particular embodiment of FIG. 32, stacked on active surface 3020 of lower electronic component 3016 is an upper, e.g., second, electronic component 3240.

Upper electronic component 3240 can be an active component such as an integrated circuit die or a passive component such as a resistor, capacitor, or inductor. In accordance with this embodiment, upper electronic component 3240 is an integrated circuit die and includes an active surface 3242 and an opposite inactive surface 3244. Upper electronic component 3240 further includes bond pads 3246 on active surface 3242.

In accordance with this embodiment, lower electronic component 3016 includes terminals 3248 on active surface 3020. Terminals 3248 are electrically connected to bond pads 3024 of lower electronic component 3016, e.g., by traces on active surface 3020. Although terminals 3248 are discussed as distinct structures with respect to bond pads 3024, in light of this disclosure, those of skill in the art will understand that terminals 3248 can be a subset of bond pads 3024. In other words, bond pads 3024 can form terminals 3248.

In accordance with the embodiment illustrated in FIG. 32, bond pads 3246 of upper electronic component 3240 are electrically and physically connected to terminals 3248 of lower electronic component 3016 by flip chip bumps 3250, e.g., solder bumps. In accordance with this embodiment, upper electronic component 3240, sometimes called a stacked die, is stacked on lower electronic component 3016 in a flip chip configuration, sometimes called a face-to-face configuration.

From stacked die attach operation 2626, flow moves to wirebond operation 2628. In wirebond operation 2628, bond pads 3024 of electronic component 3016 are electrically connected to terminals 2912 of outer circuit pattern 2910 by bond wires 3138.

Stacked die attach operation 122 is optional, and in one embodiment, is not performed. Accordingly, although only lower electronic component 3016 is illustrated in partial cavity wirebond package 2700 in the figures which follow, in light of this disclosure, those of skill in the art will understand that partial cavity wirebond package 2700 can be fabricated with an electronic component stacked in a wirebond or flip chip configuration such as that illustrated in FIGS. 31 and 32, respectively.

Returning to FIGS. 26 and 30 together, in the event that stacked die attach operation 2626 is not performed, flow moves from die attach operation 2624 to wirebond operation 2628. In wirebond operation 2628, bond pads 3024 of electronic component 3016 are electrically connected to terminals 2912 of outer circuit pattern 2910 by bond wires 3138.

Figure 33:
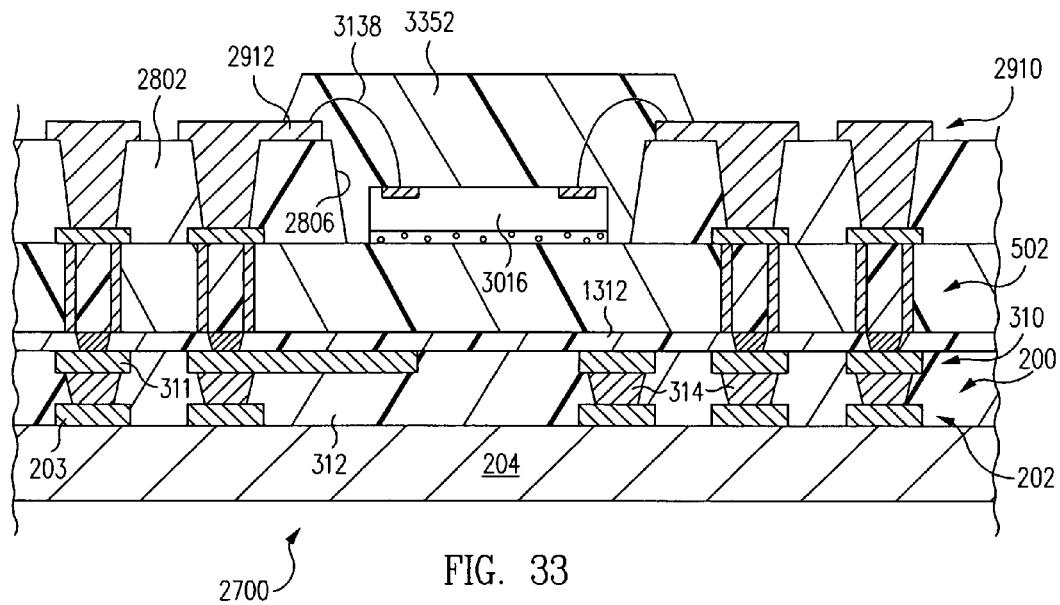

FIG. 33 is a cross-sectional view of partial cavity wirebond package 2700 of FIG. 30 at a further stage during fabrication in accordance with another embodiment. Referring now to FIGS. 26 and 33 together, from wirebond operation 2628, flow moves to an encase die in package body operation 124. Encase die in package body operation 124 of partial cavity wirebond package formation method 2600 of FIG. 26 is identical or substantially similar to encase die in package body operation 124 of partial cavity flip chip package formation method 100 of FIG. 1 and so is only briefly repeated here.

In encase die in package body operation 124, electronic component 3016 and bond wires 3138 (and any electronic components stacked thereon including bond wires) are encased in a package body 3352. More particularly, package body 3352 fills electronic component opening 2806 of buildup layer 2802 and surrounds, i.e., encases, electronic component 3016 and bond wires 3138.

Package body 3352 protects electronic component 3016 and bond wires 3138 from the ambient environment. In one embodiment, package body 3352 is applied as a liquid and cured, if necessary. In another embodiment, package body 3352 is formed by molding. In yet another embodiment, package body 3352 is formed of non-conductive paste (NCP).

Figure 34:
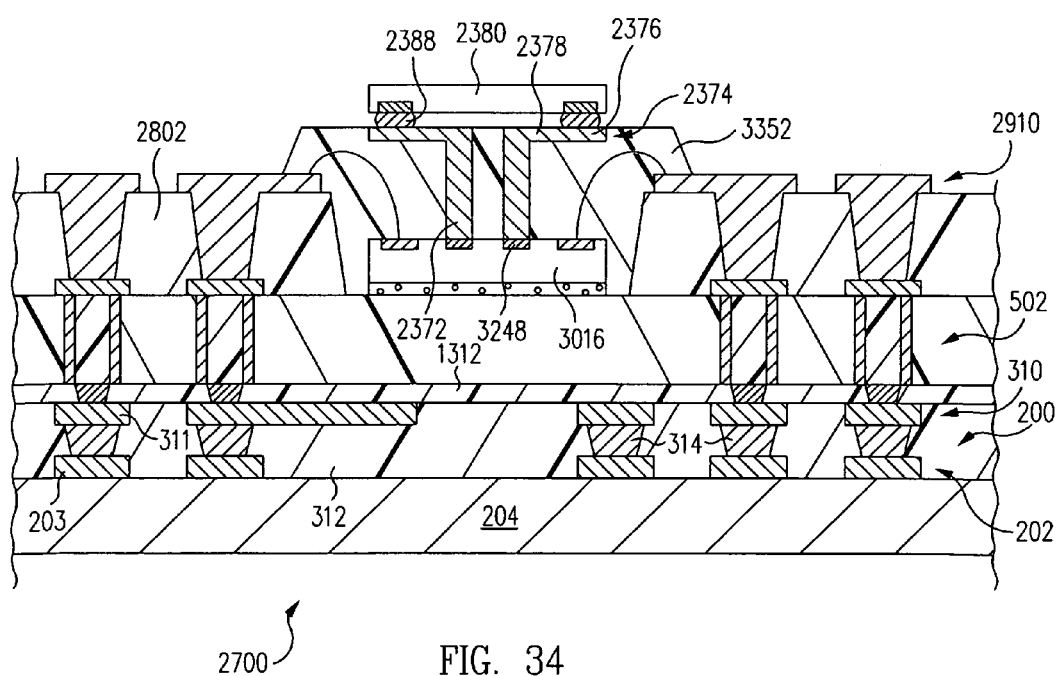
FIG. 34 is a cross-sectional view of the partial cavity wirebond package of FIG. 33 at a further stage during fabrication in accordance with one embodiment.

FIG. 34 is a cross-sectional view of partial cavity wirebond package 2700 of FIG. 33 at a further stage during fabrication in accordance with one embodiment. Referring now to FIGS. 26 and 34 together, from encase die in package body operation 124, flow moves, optionally, to a form vias in package body operation 132. From form vias in package body operation 132, flow moves to form outer circuit pattern operation 134. From form outer circuit pattern operation 134, flow moves to stacked die attach operation 136.

Form vias in package body operation 132, form outer circuit pattern operation 134, and stacked die attach operation 136 of partial cavity wirebond package formation method 2600 of FIG. 26 are identical or substantially similar to form vias in package body operation 132, form outer circuit pattern operation 134, and stacked die attach operation 136 of partial cavity flip chip package formation method 100 of FIG. 1 and so are only briefly repeated here.

As illustrated in FIG. 34, performance of form vias in package body operation 132 results in the formation of vias 2372 electrically connected to terminals 3248 of electronic component 3016. Performance of form outer circuit pattern operation 134 results in the formation of outer circuit pattern 2374 having terminals 2376 and traces 2378. Performance of stacked die attach operation 136 results in the flip chip mounting of upper electronic component 2380 to terminals 2376 by flip chip bumps 2388.

As set forth above, form vias in package body operation 132, form outer circuit pattern operation 134, and stack die attach operation 136 are optional, and in one embodiment, are not performed. Accordingly, although vias 2372, outer circuit pattern 2374, upper electronic component 2380 and flip chip bumps 2388 are not illustrated in FIG. 35 for simplicity, in light of this disclosure, those of skill in the art will understand that partial cavity wirebond package 2700 can be fabricated with vias 2372, outer circuit pattern 2374, upper electronic component 2380 and flip chip bumps 2388 in other embodiments.

Figure 35:
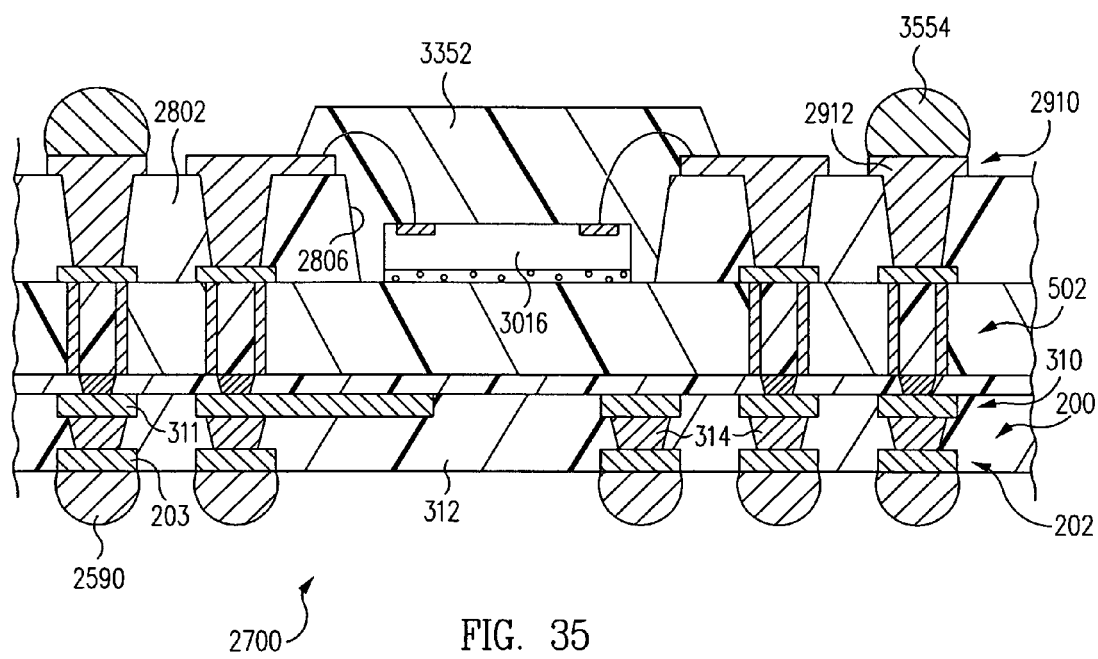
FIG. 35 is a cross-sectional view of the partial cavity wirebond package of FIG. 33 at a further stage during fabrication in accordance with one embodiment.

FIG. 35 is a cross-sectional view of partial cavity wirebond package 2700 of FIG. 33 at a further stage during fabrication in accordance with one embodiment. Referring now to FIGS. 26, 33 and 35 together, from encase die in package body operation 124 (or from stacked die attach operation 136 in the event that operations 132, 134, 136 are performed), flow moves to a remove carrier operation 138.

Remove carrier operation 138 of partial cavity wirebond package formation method 2600 of FIG. 26 is identical or substantially similar to remove carrier operation 138 of partial cavity flip chip package formation method 100 of FIG. 1 and so is only briefly repeated here. In remove carrier operation 138, carrier 204 (FIG. 33) is removed, e.g., by etching.

From remove carrier operation 138, flow moves, optionally, to a form interconnection balls operation 140. Form interconnection balls operation 140 of partial cavity wirebond package formation method 2600 of FIG. 26 is identical or substantially similar to form interconnection balls operation 140 of partial cavity flip chip package formation method 100 of FIG. 1 and so is only briefly repeated here. In form interconnection balls operation 140, lower interconnection balls 2590, e.g., a ball grid array, are formed on terminals 203 of lower circuit pattern 202. Interconnection balls 2590, e.g., solder balls, are used to electrically interconnect partial cavity wirebond package 2700 with other electrically conductive structures such as a printed circuit motherboard or other larger substrate.

In accordance with one embodiment, upper interconnection balls 3554, e.g., solder balls, are formed on terminals 2912 of outer circuit pattern 2910 in form interconnection balls operation 140. Interconnection balls 3554 are used to electrically interconnect other electronic components and/or packages to partial cavity wirebond package 2700.

In one embodiment, both lower interconnection balls 2590 and upper interconnection balls 3554 are formed in form interconnection balls operation 140. In another embodiment, only lower interconnection balls 2590 or upper interconnection balls 3554 are formed in form interconnection balls operation 140. In yet another embodiment, form interconnection balls operation 140 is not performed, and so is an optional operation.

As illustrated in FIG. 35, partial cavity wirebond package 2700 is relatively thin. More particularly, electronic component 3016 is located within electronic component opening 2806 of buildup layer 2802 thus minimizing the height of partial cavity wirebond package 2700. Further, stiffener 502 adds rigidity and strength to partial cavity wirebond package 2700 minimizing undesirable bending of partial cavity wirebond package 2700. Accordingly, the reliability of electrical interconnections formed with partial cavity wirebond package 2700 is maximized. Further, stiffener 502 acts as an internal heat sink thus maximizing heat dissipation from partial cavity wirebond package 2700.

Although the formation of a single package 1300 (FIG. 25), 2700 (FIG. 35) is illustrated and discussed above, in light of this disclosure, those of skill in the art will understand that a plurality of packages 1300 (FIG. 25), 2700 (FIG. 35) can be fabricated simultaneously. Illustratively, packages 1300 (FIG. 25), 2700 (FIG. 35) are formed in an array of packages, e.g., a 2×2, 3×3, . . . , n×m array and then the array is singulated into individual packages 1300 (FIG. 25), 2700 (FIG. 35). Alternatively, packages 1300 (FIG. 25), 2700 (FIG. 35) are formed individually.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method of forming a partial cavity package comprising:
  forming a substrate layer, the substrate layer comprising a circuit pattern comprising terminals and bump pads;
  forming a stiffener, the stiffener comprising:
    via apertures comprising electrically conductive via aperture sidewalls; and
    an electronic component opening;
  attaching the stiffener to the substrate layer;
  electrically connecting the electrically conductive via aperture sidewalls to the terminals; and
  mounting an electronic component within the electronic component opening and electrically connected to the bump pads; and
  stacking a second electronic component on the electronic component.

2. A method of forming a partial cavity package comprising:
  forming a substrate layer comprising:
  coupling a first circuit pattern to a first surface of a dielectric layer;
  coupling a second circuit pattern to a second surface of the dielectric layer, the second circuit pattern comprising terminals and bump pads; and
  electrically connecting the first circuit pattern to the second circuit pattern with electrically conductive vias extending through the dielectric layer;
  forming a stiffener, the stiffener comprising:
    via apertures comprising electrically conductive via aperture sidewalls; and
    an electronic component opening;
  attaching the stiffener to the substrate layer;
  electrically connecting the electrically conductive via aperture sidewalls to the terminals; and
  mounting an electronic component within the electronic component opening and electrically connected to the bump pads.

3. The method of claim 2 wherein the first circuit pattern is embedded into the dielectric layer at the first surface, and wherein the second circuit pattern is embedded into the dielectric layer at the second surface.

4. The method of claim 2 wherein the substrate layer is formed on a carrier.

5. The method of claim 4 further comprising removing the carrier.

6. The method of claim 2 wherein the first circuit pattern comprises terminals, the method further comprising forming interconnection balls on the terminal of the first circuit pattern.

7. The method of claim 1 wherein the stiffener comprises stiffener terminals, the method further comprising forming interconnection balls on the stiffener terminal.

8. The method of claim 1 wherein the forming the stiffener comprises:
  forming the via apertures in a dielectric stiffener core;

applying an electrically conductive material to via aperture sidewalls of the via apertures to cause the via aperture sidewalls to become the electrically conductive via aperture sidewalls; and forming the electronic component opening in the stiffener core.

9. The method of claim 1 wherein the forming the stiffener comprises:

forming the via apertures in an electrically conductive stiffener core;

applying a dielectric material to via aperture sidewalls of the via apertures to cause the via aperture sidewalls to become nonconductive;

applying an electrically conductive material to the via aperture sidewalls to cause the via aperture sidewalls to become the electrically conductive via aperture sidewalls; and forming the electronic component opening in the stiffener core.

10. The method of claim 1 wherein the attaching the stiffener to the substrate layer comprises attaching the stiffener to the substrate layer with a stiffener attachment layer.

11. The method of claim 10 wherein the electrically connecting the electrically conductive via aperture sidewalls to the terminals comprises:

forming via apertures in the stiffener attachment layer to expose the terminals; and filling the via apertures in the stiffener attachment layer with an electrically conductive material to electrically connect the electrically conductive via aperture sidewalls to the terminals.

12. The method of claim 10 further comprising forming via apertures in the stiffener attachment layer to expose the bump pads.

13. The method of claim 12 wherein the mounting comprises electrically connecting bond pads on an active surface of the electronic component to the bump pads with flip chip bumps extending through the via apertures in the stiffener attachment layer.

14. The method of claim 1 further comprising:

filling the via apertures with a via aperture filling material; and forming stiffener terminals on the stiffener electrically connected with the electrically conductive via aperture sidewalls, the stiffener terminals being formed directly above the via aperture filling material.

15. The method of claim 1 further comprising encasing the electronic component in a package body, the package body filling the electronic component opening.

16. A method of forming a partial cavity package comprising:

forming a substrate layer, the substrate layer comprising a circuit pattern comprising terminals and bump pads;

forming a stiffener, the stiffener comprising:
via apertures comprising electrically conductive via aperture sidewalls; and
an electronic component opening;

attaching a first surface of the stiffener to the substrate layer;

electrically connecting the electrically conductive via aperture sidewalls to the terminals;

mounting an electronic component within the electronic component opening and electrically connected to the bump pads;

encasing the electronic component in a package body, the package body filling the electronic component opening;

attaching a first surface of a buildup layer to a second surface of the stiffener;

forming vias in the buildup layer, the vias being electrically connected to stiffener terminals of the stiffener; and forming an outer circuit pattern coupled to a second surface of the buildup layer, the outer circuit pattern being electrically connected to the vias in the buildup layer.

17. A method of forming a partial cavity package comprising:

forming a substrate layer, the substrate layer comprising a circuit pattern comprising terminals and bump pads;

forming a stiffener, the stiffener comprising:
via apertures comprising electrically conductive via aperture sidewalls; and
an electronic component opening;

attaching the stiffener to the substrate layer;

electrically connecting the electrically conductive via aperture sidewalls to the terminals; and mounting an electronic component within the electronic component opening and electrically connected to the bump pads;

encasing the electronic component in a package body, the package body filling the electronic component opening;

forming vias in the package body electrically connected to through silicon vias of the electronic component;

forming an outer circuit pattern coupled to a primary surface of the package body; and mounting a second electronic component to the outer circuit pattern.

18. A method of forming a partial cavity package comprising:

forming a stiffener;

forming stiffener terminals on the stiffener;

attaching a buildup layer to the stiffener;

patterning the buildup layer to form via apertures and an electronic component opening in the buildup layer, the via apertures exposing the stiffener terminals;

filling the via apertures to form vias in the buildup layer electrically connected to the stiffener terminals;

forming an outer circuit pattern coupled to the buildup layer and electrically connected to the vias in the buildup layer;

mounting an electronic component to the stiffener and within the electronic component opening; and electrically connecting the electronic component to the outer circuit pattern.

19. A method of forming a partial cavity package comprising:

forming a substrate layer;

forming a stiffener;

attaching the stiffener to the substrate layer;

forming stiffener terminals on the stiffener;

attaching a buildup layer to the stiffener;

patterning the buildup layer to form via apertures and an electronic component opening in the buildup layer, the via apertures exposing the stiffener terminals;

filling the via apertures to form vias in the buildup layer electrically connected to the stiffener terminals;

forming an outer circuit pattern coupled to the buildup layer and electrically connected to the vias in the buildup layer;

mounting an electronic component to the stiffener and within the electronic component opening; and electrically connecting the electronic component to the outer circuit pattern.

* * * * *